(12) United States Patent
Chen et al.

(10) Patent No.: US 12,287,546 B2
(45) Date of Patent: Apr. 29, 2025

(54) DISPLAY SUBSTRATE, DISPLAY PANEL, DISPLAY DEVICE, METHOD OF DETECTING POST SPACER, AND METHOD OF MANUFACTURING POST SPACER

(71) Applicants: BEIJING BOE DISPLAY TECHNOLOGY CO., LTD., Beijing (CN); BOE TECHNOLOGY GROUP CO., LTD., Beijing (CN)

(72) Inventors: Yuqiong Chen, Beijing (CN); Rui Zhang, Beijing (CN); Hongshu Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/541,174

(22) Filed: Dec. 15, 2023

(65) Prior Publication Data
US 2024/0111193 A1 Apr. 4, 2024

Related U.S. Application Data

(63) Continuation of application No. 17/462,582, filed on Aug. 31, 2021, now Pat. No. 11,899,318, which is a (Continued)

(30) Foreign Application Priority Data

Mar. 11, 2020 (CN) .......................... 202010168380.5

(51) Int. Cl.
*G02F 1/1339* (2006.01)
*G03F 7/00* (2006.01)
(Continued)

(52) U.S. Cl.
CPC ...... *G02F 1/13396* (2021.01); *G02F 1/13394* (2013.01); *G03F 7/0007* (2013.01);
(Continued)

(58) Field of Classification Search
CPC ............. G02F 1/13396; G02F 1/13394; G02F 1/136222; G02F 1/133512; G02F 1/136209; G02F 1/1368; G03F 7/0007
See application file for complete search history.

(56) References Cited

U.S. PATENT DOCUMENTS

2018/0341141 A1* 11/2018 Lin .................. G02F 1/133514
2018/0341161 A1 11/2018 Lin et al.

FOREIGN PATENT DOCUMENTS

CN 103885217 A 6/2014
CN 104155781 A 11/2014
(Continued)

OTHER PUBLICATIONS

Hearing Notice for Indian patent application No. 202227042817, date of dispatch Jan. 12, 2024, 3 pages.
(Continued)

*Primary Examiner* — Angela M. Medich
(74) *Attorney, Agent, or Firm* — Westman, Champlin & Koehler, P.A.

(57) ABSTRACT

A display substrate is provided, including: a base substrate; a plurality of sub-pixels arranged on the base substrate in an array in a row direction and a column direction; a plurality of post spacers arranged at intervals on the base substrate, wherein the plurality of post spacers include at least one main post spacer and a plurality of sub post spacers, and each main post spacer has a height greater than that of each sub post spacer. Each sub-pixel has at most one post spacer provided therein, the plurality of sub-pixels include a main sub-pixel provided with the main post spacer and a sub
(Continued)

sub-pixel provided with the sub post spacer, and the plurality of sub-pixels further include at least one mark sub-pixel adjacent to the main sub-pixel in the row direction or the column direction, the at least one mark sub-pixel is provided with no post spacer.

15 Claims, 20 Drawing Sheets

Related U.S. Application Data continuation-in-part of application No. PCT/CN2020/140698, filed on Dec. 29, 2020.

(51) Int. Cl.
    *G02F 1/1335* (2006.01)
    *G02F 1/1362* (2006.01)
    *G02F 1/1368* (2006.01)

(52) U.S. Cl.
    CPC .. *G02F 1/133512* (2013.01); *G02F 1/136209* (2013.01); *G02F 1/136222* (2021.01); *G02F 1/1368* (2013.01)

(56) References Cited

FOREIGN PATENT DOCUMENTS

| | | | |
|---|---|---|---|
| CN | 104516158 | A | 4/2015 |
| CN | 105093581 | A | 11/2015 |
| CN | 105353567 | A | 2/2016 |
| CN | 206363059 | U | 7/2017 |
| CN | 107817632 | A | 3/2018 |
| CN | 108803122 | A | 11/2018 |
| CN | 211293538 | U | 8/2020 |
| JP | 2018072855 | A | 5/2018 |

OTHER PUBLICATIONS

Examination report under sections 12 & 13, for Indian Patent Application No. 202227042817, dated Oct. 21, 2022, 6 pages.

U.S. Patent Office issued prosecution for U.S. Appl. No. 17/462,582, filed Aug. 31, 2021, including: Notice of Allowance and Fees Due (PTOL-85) issued Oct. 12, 2023, 8 pages; Non-Final Rejection issued Jun. 23, 2023, 10 pages; Restriction Requirement issued Mar. 17, 2023, 6 pages; 24 pages total.

Office Action issued in corresponding Chinese Application No. 202010168380.5, dated Mar. 7, 2025, 17 pages.

\* cited by examiner

DISPLAY SUBSTRATE, DISPLAY PANEL, DISPLAY DEVICE, METHOD OF DETECTING POST SPACER, AND METHOD OF MANUFACTURING POST SPACER

CROSS-REFERENCE TO RELATED APPLICATION

This application is a continuation application of U.S. patent application Ser. No. 17/462,582, filed on Aug. 31, 2021, which in turn is a continuation-in-part (Bypass) of International Application No. PCT/CN2020/140698, filed on Dec. 29, 2020, entitled "DISPLAY SUBSTRATE, DISPLAY PANEL, DISPLAY DEVICE, METHOD OF DETECTING POST SPACER, AND METHOD OF MANUFACTURING POST SPACER" which claims priority to Chinese Application No. 202010168380.5, filed on Mar. 11, 2020, the contents of which are incorporated herein by reference in their entireties.

TECHNICAL FIELD

The present disclosure relates to a field of display technology, and in particular to a display substrate, a display panel, a display device, a method of detecting a post spacer on a display substrate, and a method of manufacturing a post spacer.

BACKGROUND

Generally, a liquid crystal display panel includes a color filter substrate, an array substrate, a liquid crystal layer sandwiched between the color filter substrate and the array substrate, and a sealant frame. A cell gap of the display panel is generally controlled by a height of a post spacer (or called a photo spacer or PS) arranged between the array substrate and the color filter substrate. The cell gap has an important influence on structural parameters and display quality of the liquid crystal display panel.

In current liquid crystal display device, at least two post spacers, for example, a main post spacer and a sub post spacer, are generally provided to provide sufficient support strength, so as to prevent various mura or defects. In this case, how to accurately identify or detect the main post spacer so as to avoid poor production due to mis-recognition or mis-detection is an important issue faced by those skilled in the art.

The above information disclosed in this section is only for the understanding of the background of the inventive concept of the present disclosure. Therefore, the above information may contain information that does not constitute a related art.

SUMMARY

In one aspect, there is provided a display substrate, including:
a base substrate;
a plurality of sub-pixels arranged on the base substrate in an array in a row direction and a column direction; and
a plurality of post spacers arranged at intervals on the base substrate, wherein the plurality of post spacers include at least one main post spacer and a plurality of sub post spacers, and each main post spacer of the at least one main post spacer has a height greater than a height of each of the sub post spacers,
wherein each of the plurality of sub-pixels has at most one of the plurality of post spacers provided therein, the plurality of sub-pixels comprise a main sub-pixel provided with the main post spacer and a sub sub-pixel provided with the sub post spacer, the plurality of sub-pixels further comprise at least one mark sub-pixel adjacent to the main sub-pixel in the row direction or the column direction, and the at least one mark sub-pixel is provided with none of the plurality of post spacers.

According to some exemplary embodiments, the display substrate includes a plurality of main post spacers, a plurality of main sub-pixels and a plurality of mark sub-pixels, each main sub-pixel of the main sub-pixels is provided with only one of the main post spacers, the plurality of mark sub-pixels are respectively adjacent to the plurality of main sub-pixels, and the plurality of mark sub-pixels are located on the same side of respective adjacent main sub-pixels, or the plurality of mark sub-pixels are located on both sides of respective adjacent main sub-pixels.

According to some exemplary embodiments, said each main post spacer is adjacent to two sub post spacers of the sub post spacers in the row direction, and in a post spacer group including said each main post spacer and the two sub post spacers adjacent to said each main post spacer in the row direction, a separation distance between said each main post spacer and one of the two sub post spacers is greater than or equal to a separation distance between said each main post spacer and the other of the two sub post spacers.

According to some exemplary embodiments, each main post spacer is adjacent to two sub post spacers in the row direction, and in the post spacer group including said each main post spacer and the two sub post spacers adjacent to said main post spacer in the row direction, the separation distance between said each main post spacer and one of the two sub post spacers is more than 2 times the separation distance between said main post spacer and the other of the two sub post spacers.

According to some exemplary embodiments, four main post spacers adjacent in the row direction and the column direction are arranged in a quadrilateral including a first diagonal line parallel to the row direction and a second diagonal line parallel to the column direction.

According to some exemplary embodiments, four main post spacers adjacent in the row direction and the column direction are arranged in a quadrilateral including a first diagonal line having a first acute angle with the row direction and a second diagonal line parallel to the column direction.

According to some exemplary embodiments, two adjacent sides of the quadrilateral in the row direction have the same length, and two adjacent sides of the quadrilateral in the column direction have different lengths.

According to some exemplary embodiments, the quadrilateral includes a parallelogram.

According to some exemplary embodiments, the first diagonal line has a length greater than a length of the second diagonal line; or the first diagonal line has a length smaller than a length of the second diagonal line.

According to some exemplary embodiments, a ratio of a length of a longer diagonal line of the first diagonal line and the second diagonal line to a length of a shorter diagonal line of the first diagonal line and the second diagonal line is greater than 1 and less than or equal to 4.

According to some exemplary embodiments, four main post spacers adjacent in the row direction and the column direction are arranged in a quadrilateral including a first diagonal line having a first acute angle with the row direction and a second diagonal line having a second acute angle with the column direction, a geometric center of each post spacer has a deviation in the row direction with respect to a geometric center of a sub-pixel where said each post spacer is located, wherein post spacers located in adjacent rows have opposite deviation directions, and post spacers located in the same row have the same deviation direction.

According to some exemplary embodiments, the opposite deviation directions comprises a first direction and a second direction opposite to the first direction, post spacers having a deviation direction in the first direction are each located in a single sub-pixel, and post spacers having a deviation direction in the second direction are each located between two adjacent sub-pixels in the row direction.

According to some exemplary embodiments, the plurality of sub-pixels comprises a red sub-pixel, a green sub-pixel and a blue sub-pixel, the post spacers having a deviation direction in the first direction are each located in the red sub-pixel, the post spacers having a deviation direction in the second direction are each located between the red sub-pixel and the blue sub-pixel adjacent to the red sub-pixel in the row direction.

According to some exemplary embodiments, the display substrate further comprises a black matrix arranged on the base substrate, an orthographic projection of the black matrix on the base substrate is a plurality of strips that extend in the row direction and are arranged in the column direction, each of the plurality of strips includes a first area overlapping an orthographic projection of the main post spacer on the base substrate and a second area overlapping an orthographic projection of the sub post spacer on the base substrate, a size of the first area in the column direction is greater than a size of the second area in the column direction, an edge of the first area expands in a circular arc shape in the second direction, and the main post spacer is located at a center of the first area.

According to some exemplary embodiments, the display substrate is a color filter substrate, the display substrate further includes a black matrix arranged on the base substrate and a color filter layer arranged on the base substrate, and an orthographic projection of each of the post spacers falls within an orthographic projection of the black matrix on the base substrate.

According to some exemplary embodiments, the display substrate is a COA array substrate, and the display substrate further includes:
  a plurality of thin film transistors arranged on the base substrate;
  a black matrix arranged on a side of the thin film transistors away from the base substrate; and
  a color filter layer arranged on a side of the black matrix away from the base substrate,
  wherein an orthographic projection of each of the post spacers on the base substrate falls within an orthographic projection of the black matrix on the base substrate.

According to some exemplary embodiments, the orthographic projection of said each of the post spacers falls within an orthographic projection of the thin film transistors on the base substrate.

According to some exemplary embodiments, the mark sub-pixel is a green sub-pixel.

In another aspect, there is provided a display panel, including the display substrate described above.

According to some exemplary embodiments, the display panel further includes an array substrate, and the array substrate includes: a base substrate; and a plurality of thin film transistors arranged on the base substrate, wherein the orthographic projection of each of the post spacers on the base substrate falls within an orthographic projection of the thin film transistors on the base substrate.

In another aspect, there is provided a display device, including the display panel described above.

In another aspect, there is provided a method of detecting a post spacer on a display substrate, including:
  placing a display substrate to be detected on a detection device, wherein the display substrate to be detected is the display substrate described above;
  photographing each sub-pixel of the display substrate by using a camera of the detection device, so as to obtain an image of each sub-pixel;
  capturing the mark sub-pixel; and
  determining a post spacer provided in a sub-pixel adjacent to the mark sub-pixel as a main post spacer.

In yet another aspect, there is provided a method of manufacturing a post spacer, including:
  depositing an organic material layer on a base substrate, wherein the organic material is deposited to make a post spacer;
  applying a photoresist layer on the organic material layer; and
  exposing and developing the photoresist layer by using a mask plate including a full exposure region and a partial exposure region, so as to form a main post spacer in a region of the base substrate corresponding to the full exposure region of the mask plate and form a sub post spacer in a region of the base substrate corresponding to the partial exposure region of the mask plate,
  wherein the mask plate includes a plurality of full exposure regions and a plurality of partial exposure regions arranged at intervals in the row direction and the column direction, and each full exposure region of the full exposure regions is arranged adjacent to two partial exposure regions of the partial exposure regions in the row direction; and
  wherein, in a group including said each full exposure region and the two partial exposure regions adjacent to said each full exposure region in the row direction, a distance between said each full exposure region and one of the two partial exposure regions is greater than a distance between said each full exposure region and the other of the two partial exposure regions.

In yet another aspect, there is provided a display substrate, including:
  a base substrate;
  a plurality of sub-pixels arranged on the base substrate in an array in a row direction and a column direction; and
  a plurality of post spacers arranged at intervals on the base substrate, wherein the plurality of post spacers comprise at least one main post spacer and a plurality of sub post spacers, and each main post spacer of the at least one main post spacer has a height greater than a height of each of the sub post spacers,
  wherein each of the plurality of sub-pixels has at most one of the plurality of post spacers provided therein, the plurality of sub-pixels comprise a main sub-pixel provided with the main post spacer and a sub sub-pixel provided with the sub post spacer, the plurality of sub-pixels further comprise at least one vice sub-pixel adjacent to the main sub-pixel in the row direction or the column direction, and the at least one vice sub-pixel is provided with none of the plurality of post spacers, wherein four vice sub-pixels adjacent in the row direction and the column direction are arranged in a quadrilateral including a first diagonal line having a first acute angle with the row direction and a second diagonal line having a second acute angle with the column direction.

BRIEF DESCRIPTION OF THE DRAWINGS

With following description of the present disclosure with reference to the drawings, other objectives and advantages of the present disclosure would be clear and the present disclosure would be understood comprehensively.

FIG. 22A and FIG. 22B respectively show a side view and a top view of the post spacer included in the display panel according to other embodiments of the present disclosure.

Figure 1:
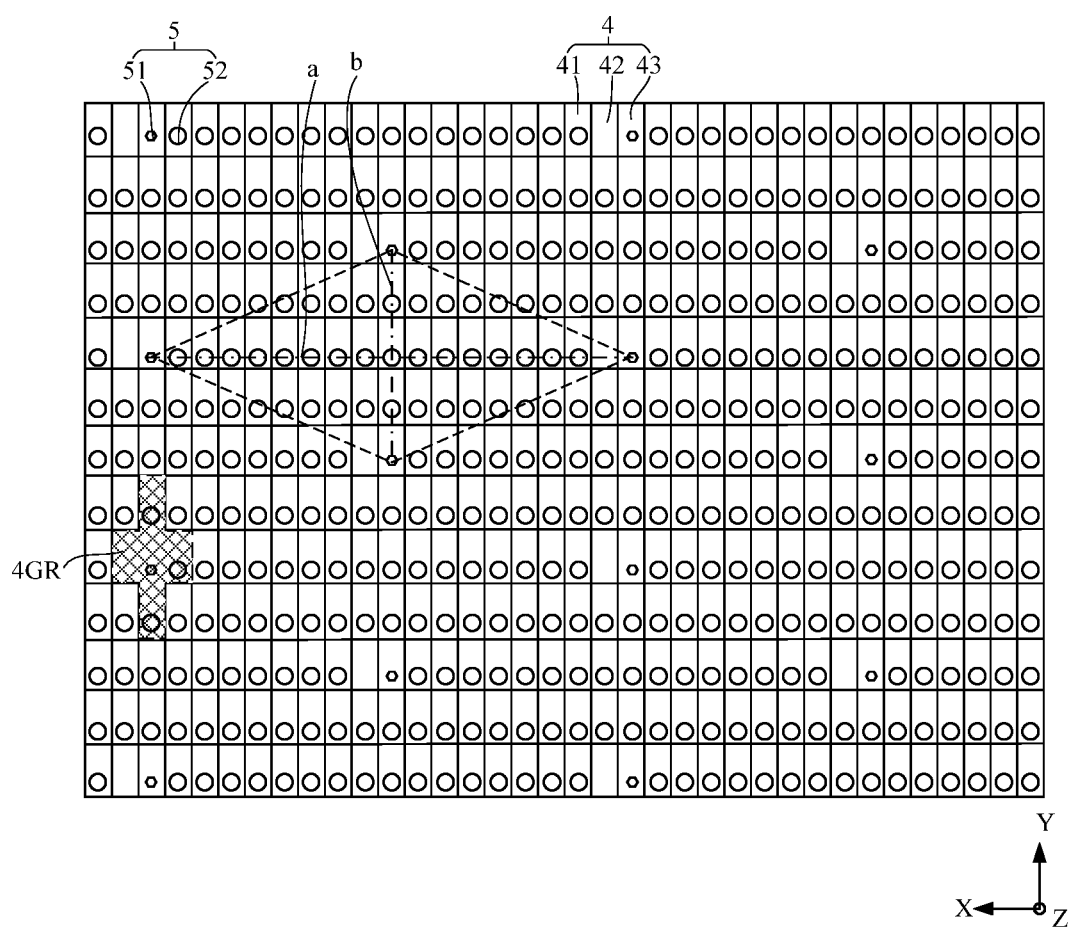
FIG. 1 shows a schematic plan view of a distribution of post spacers on a display panel according to some embodiments of the present disclosure.

It should be noted that for the sake of clarity, in the drawings used to describe the embodiments of the present disclosure, sizes of layers, structures or areas may be enlarged or reduced, that is, these drawings are not drawn according to actual scale.

DETAILED DESCRIPTION OF EMBODIMENTS

In the following description, for the purpose of explanation, many specific details are set forth to provide a comprehensive understanding of various exemplary embodiments. However, it may be understood that the various exemplary embodiments may be implemented without these specific details or with one or more equivalent arrangements. In other cases, well-known structures and devices are shown in block diagrams in order to avoid unnecessarily obscuring the various exemplary embodiments. In addition, the various exemplary embodiments may be different, but need not be exclusive. For example, without departing from the inventive concept, specific shape, configuration and characteristics of an exemplary embodiment may be used or implemented in another exemplary embodiment.

In the drawings, for clarity and/or description purposes, size and relative size of elements may be enlarged. Accordingly, the size and relative size of each element need not to be limited to those shown in the drawings. When the exemplary embodiments may be implemented differently, the specific process sequence may be different from the sequence described. For example, two consecutively described processes may be performed substantially simultaneously or in a reverse order. In addition, same reference numerals represent same elements.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is provided. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X-axis, Y-axis and Z-axis are not limited to three axes of a rectangular coordinate system, and may be interpreted in a broader meaning. For example, the X-axis, the Y-axis and the Z-axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be understood that, although terms "first," "second" and so on may be used herein to describe different elements, these elements should not be limited by these terms. These terms are only used to distinguish one element from another. For example, without departing from the scope of the exemplary embodiments, a first element may be named as a second element, and similarly, the second element may be named as the first element.

For the purpose of descriptive, spatial relative terms such as "under", "below", "lower", "on", "above", "upper", "higher" or "side" (for example, in a "side wall") may be used herein to describe a relationship between one element and another (or other) element(s) as shown in the drawings. In addition to the orientation depicted in the drawings, the spatial relative terms are also intended to encompass different orientations of the device in use, operation, and/or manufacture. For example, if the device in the drawings is turned over, an element described as "under" or "below" other elements or features may then be oriented "on" or "above" the other elements or features. Therefore, the exemplary term "below" may encompass two orientations including above and below. In addition, the device may be otherwise positioned (for example, rotated by 90 degrees or in other orientations), so that the spatial relative terms used herein are explained accordingly.

The terms are used herein for the purpose of describing specific embodiments and are not intended for limitation. As used herein, unless otherwise specified in the context, a singular form such as "a", "one", "the" is also intended to include a plural form. Moreover, when the term "include" is used in this specification, the term indicates the presence of the stated features, wholes, steps, operations, elements, components and/or groups thereof, but does not exclude the presence or addition of one or more other features, other wholes, other steps, other operations, other elements, other components and/or groups thereof. It should also be noted that, as used herein, the terms "substantially", "about" and other similar terms are used as approximation terms rather than degree terms. Thus, the terms "substantially", "about" and other similar terms are used to describe an inherent deviation of the measured value, calculated value, and/or provided value that those ordinary skilled in the art may recognize.

Unless otherwise defined, all terms (including technical and scientific terms) used herein have the same meaning as those generally understood by those ordinary skilled in the art to which the present disclosure belongs.

Herein, the expression "main sub-pixel" means a sub-pixel provided with a main post spacer, the expression "sub sub-pixel" means a sub-pixel provided with a sub post spacer, and the expression "mark sub-pixel" means a sub-pixel provided with no post spacer (neither the main post spacer nor the sub post spacer is provided).

Herein, the expression "the plurality of mark sub-pixels are located on the same side of adjacent main sub-pixels" means the relative positional relationship between each mark sub-pixel and an adjacent main sub-pixel. For example, when each mark sub-pixel is located on a left side of an adjacent main sub-pixel, this is one of the cases that the plurality of mark sub-pixels are located on the same side of adjacent main sub-pixels, but the present disclosure is not limited to this.

Those skilled in the art should understand that herein, unless otherwise specified, the expression "height" refers to a size in a direction perpendicular to a surface of the display substrate provided with various film layers (for example, a color filter substrate or an array substrate), that is, a size in a light exit direction of the display substrate.

Hereinafter, exemplary embodiments of the present disclosure will be described with reference to the drawings.

Figure 2:
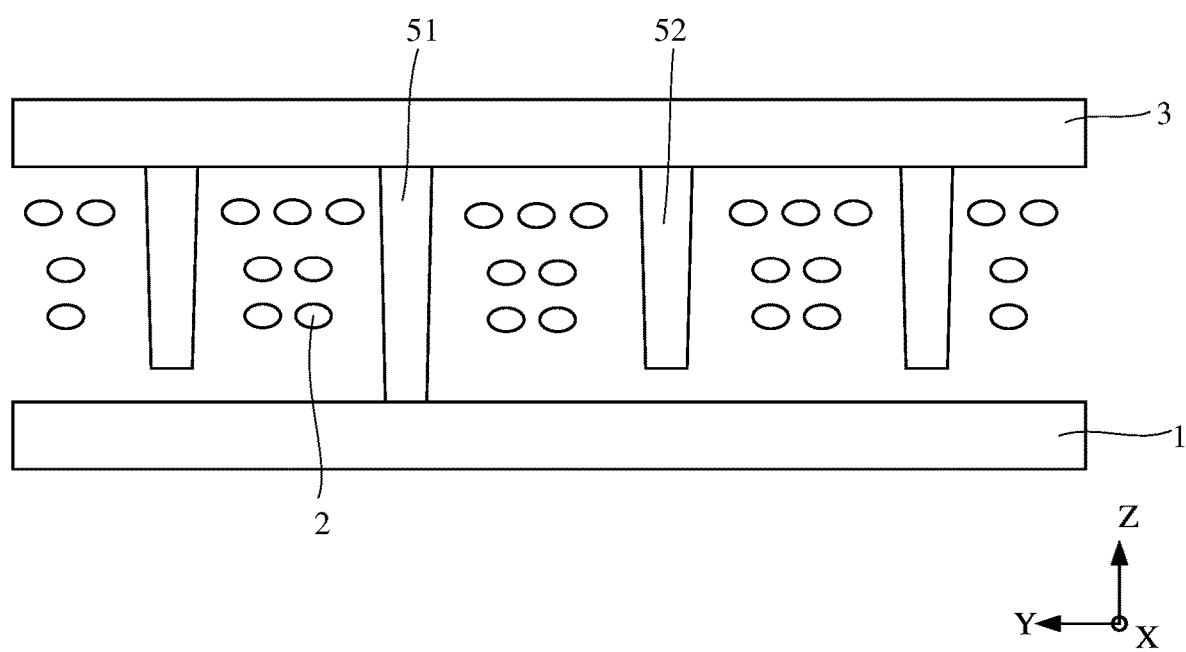
FIG. 2 shows a schematic cross-sectional view of a display panel according to some embodiments of the present disclosure.
Figure 3:
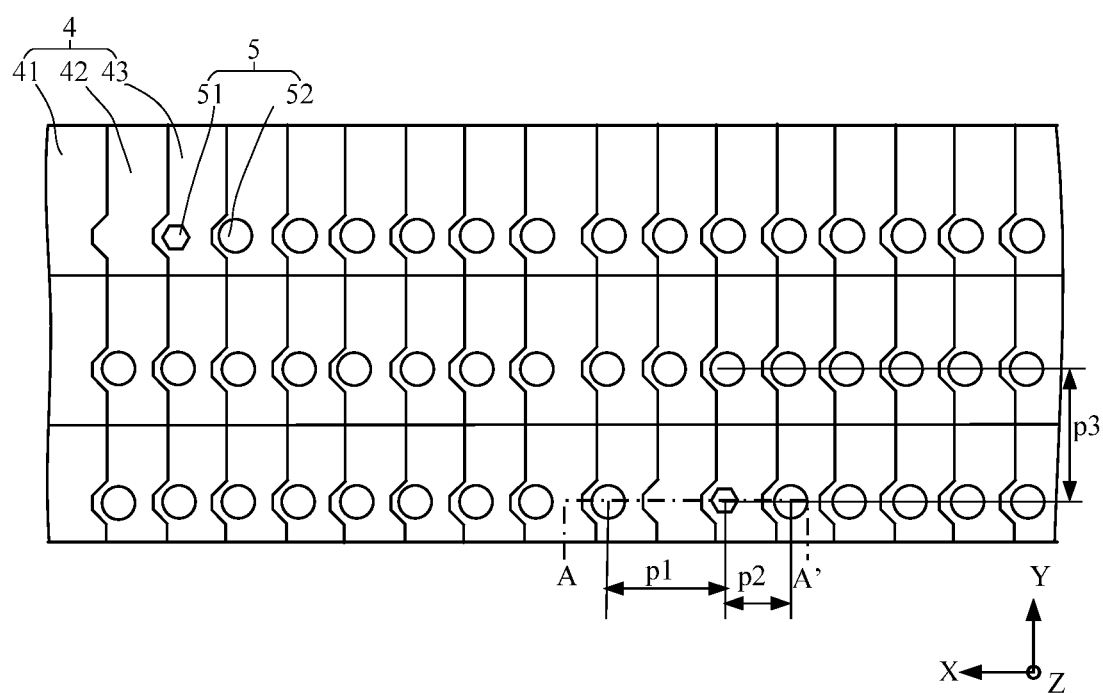
FIG. 3 shows a partial enlarged view of a display panel according to some embodiments of the present disclosure.

FIG. 1 shows a schematic plan view of a distribution of post spacers on a display panel according to some embodiments of the present disclosure. FIG. 2 shows a schematic cross-sectional view of the display panel according to some embodiments of the present disclosure. FIG. 3 shows a partial enlarged view of the display panel according to some embodiments of the present disclosure. Referring to FIG. 1 and FIG. 2, a display panel according to the embodiments of the present disclosure may include a first substrate 1, a second substrate 3, and a liquid crystal layer 2 filled between the first substrate 1 and the second substrate 3. The first substrate 1 and the second substrate 3 are bonded to each other by, for example, a sealant, to form a liquid crystal cell. A plurality of post spacers (or called photo spacer or PS) 5 are arranged at intervals between the first substrate 1 and the second substrate 3. Specifically, the plurality of post spacers 5 may include a plurality of main post spacers 51 and a plurality of sub post spacers 52.

It should be noted that in the schematic plan views shown in FIG. 1 and FIG. 3, the main post spacer 51 is represented by a "hexagon", and the sub post spacer 52 is represented by a "circle". This is only for distinction and convenience, and does not mean a restriction on the shapes of the main post spacer and the sub post spacer. The shapes of the main post spacer and the sub post spacer will be described in more detail below.

In the embodiments of the present disclosure, referring to FIG. 2, a height of the main post spacer 51 is greater than that of the sub post spacer 52. For example, the height of the sub post spacer 52 may be 70% to 95% of the height of the main post spacer 51. In a case that the first substrate 1 and the second substrate 3 are normally aligned, the main post spacer 51 plays a supporting role. When the display panel is squeezed by a large external force, the sub post spacer 52 may also play a supporting role to improve a pressure resistance. When the squeeze is eliminated, the main post spacer may provide a restoring force. By arranging the main post spacer and the sub post spacer with different heights, the supporting ability of the post spacers may be improved, and various mura or defects may be prevented.

Referring to FIG. 1 and FIG. 3 in combination, the display panel may include a plurality of sub-pixels 4 arranged in an array, that is, arranged in a row direction (X-direction as shown) and a column direction (Y-direction as shown). The plurality of sub-pixels 4 may include at least a first sub-pixel 41, a second sub-pixel 42 and a third sub-pixel 43. For example, the first sub-pixel 41, the second sub-pixel 42 and the third sub-pixel 43 may be a red sub-pixel, a green sub-pixel and a blue sub-pixel, respectively.

The plurality of post spacers 5 are respectively provided in the plurality of sub-pixels 4. Continuing to refer to FIG. 1 and FIG. 3, each sub-pixel 4 is provided with at most one post spacer 5 (one of the main post spacer 51 and the sub post spacer 52).

In the embodiments of the present disclosure, a number of the main post spacer 51 may be less than that of the sub post spacer 52. For example, the number of the sub post spacer 52 may be 2 to 10 times that of the main post spacer 51.

The plurality of post spacers 5 are arranged at intervals between the first substrate 1 and the second substrate 3. A distance between two main post spacers 51 adjacent to each other in the row direction X or the column direction Y is greater than that between two sub post spacers 52 adjacent to each other in the row direction X or the column direction Y, that is, the main post spacers 51 are arranged at greater intervals. Referring to FIG. 1 and FIG. 3, the sub-pixels provided with the main post spacers 51 are not adjacent to each other. For example, a plurality of sub-pixels may be arranged between two main post spacers 51 adjacent to each other in the row direction X or the column direction Y. For example, there may be seventeen sub-pixels between two main post spacers 51 adjacent to each other in the row direction X, and there may be three sub-pixels between two main post spacers 51 adjacent to each other in the column direction Y.

Figure 17:
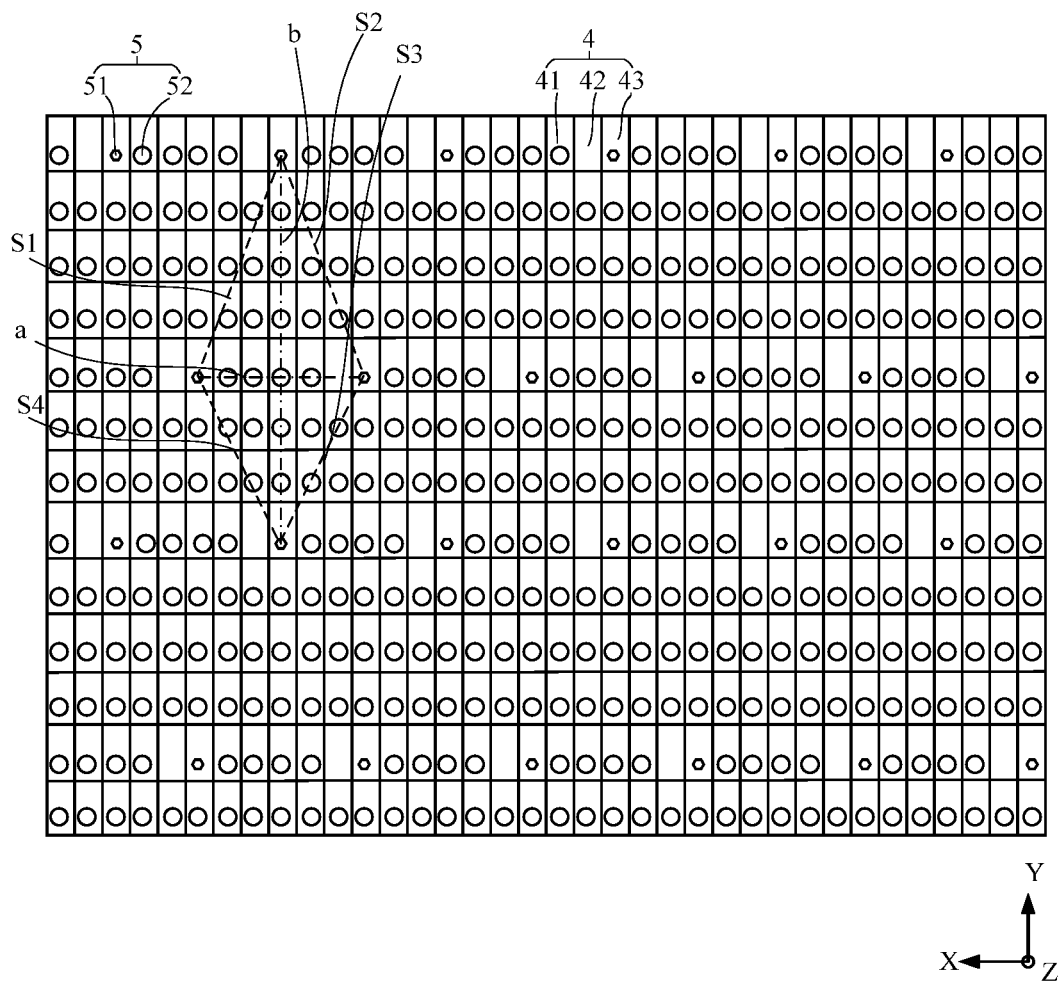
FIG. 17 shows a schematic plan view of a distribution of post spacers on a display panel according to other embodiments of the present disclosure.
Figure 18:
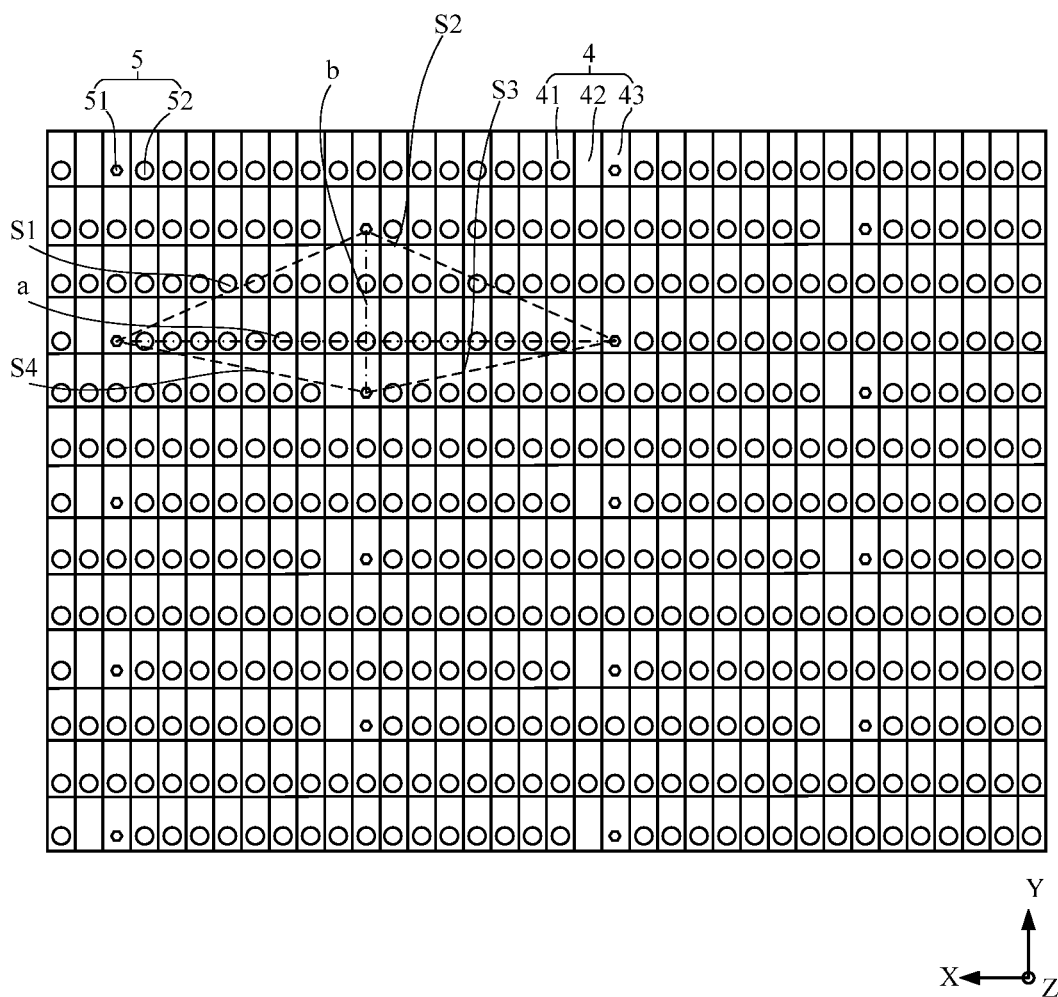
FIG. 18 shows a schematic plan view of a distribution of post spacers on a display panel according to other embodiments of the present disclosure.

Referring to FIG. 1, FIG. 17 and FIG. 18, the plurality of main post spacers 51 may be arranged in a quadrilateral. Specifically, four main post spacers 51 adjacent to each other in the row direction X and the column direction Y are arranged in a quadrilateral. The quadrilateral includes a first diagonal line a parallel to the row direction X and a second diagonal line b parallel to the column direction Y.

As shown in FIG. 1, the quadrilateral formed with four main post spacers 51 adjacent to each other in the row direction X and the column direction Y as vertices may be a parallelogram having a first diagonal line a parallel to the row direction X and a second diagonal line b parallel to the column direction Y. For example, the display panel has a shape of a rectangle, that is, an orthographic projection of the display panel in Z-direction (that is, a thickness direction) as shown is a rectangle. The row direction X is parallel to a long side of the rectangle, and the column direction Y is parallel to a short side of the rectangle. The first diagonal line a has a length (that is, a size in the row direction X) greater than that of the second diagonal line b (that is, a size in the column direction Y). For example, a ratio of the length of the first diagonal line a to the length of the second diagonal line b is greater than 1 and less than or equal to 4. In some examples, a ratio of the length of the first diagonal line a to the length of the second diagonal line b may be equal to 2. In some examples, the ratio of the length of the first diagonal line a to the length of the second diagonal line b may be equal to 3.5.

However, the present disclosure does not limit to this. In addition to the parallelogram, the quadrilateral formed with four main post spacers 51 adjacent to each other in the row direction X and the column direction Y as vertices may be any shape having a first diagonal line a parallel to the row direction X and a second diagonal line b parallel to the column direction Y. The quadrilateral may be axially symmetrical about the second diagonal line b parallel to the column direction Y, and the first diagonal line a parallel to the row direction X is vertically bisected by the second diagonal line b parallel to the column direction Y.

For example, as shown in FIG. 17, the quadrilateral has four sides S1, S2, S3 and S4. One end of the diagonal a is a vertices formed by an intersection of the sides S1 and S4, and the other end of the diagonal a is a vertices formed by an intersection of the sides S2 and S3. One end of the diagonal b is a vertices formed by an intersection of the sides S1 and S2, and the other end of the diagonal b is a vertices formed by an intersection of the sides S3 and S4. The quadrilateral shown in FIG. 17 is axially symmetrical about the diagonal line b, where the side S1 is axially symmetrical to the side S2 about the diagonal line b, the side S3 is axially symmetrical to the side S4 about the diagonal line b, the diagonal a is vertically bisected by the diagonal b, and a distance between the one end of the diagonal a and the diagonal b is equal to a distance between the other end of the diagonal a and the diagonal b. In FIG. 17, two adjacent sides of the quadrilateral in the row direction have the same length, and two adjacent sides of the quadrilateral in the column direction have different lengths. For example, the sides S1 and S2 have the same length, the sides S3 and S4 have the same length, while the sides S1 and S4 have different lengths, and the sides S2 and S3 have different lengths. As shown in FIG. 17, the length of the side S1 is greater than the length of the side S4, the length of the side S2 is greater than the length of the side S3, and the length of the first diagonal a is smaller than the length of the second diagonal b. For example, the ratio of the length of the second diagonal line b to the length of the first diagonal line a is greater than 1 and less than or equal to 4. In some examples, the ratio of the length of the second diagonal line b to the length of the first diagonal line a may be equal to 2. In some examples, the ratio of the length of the second diagonal line b to the length of the first diagonal line a may be equal to 3.5.

For example, as shown in FIG. 18, the quadrilateral has four sides S1, S2, S3 and S4. One end of the diagonal a is a vertices formed by an intersection of the sides S1 and S4, and the other end of the diagonal a is a vertices formed by an intersection of the sides S2 and S3. One end of the diagonal b is a vertices formed by an intersection of the sides S1 and S2, and the other end of the diagonal b is a vertices formed by an intersection of the sides S3 and S4. The quadrilateral shown in FIG. 18 is axially symmetrical about the diagonal line b, where the side S1 is axially symmetrical to the side S2 about the diagonal line b, the side S3 is axially symmetrical to the side S4 about the diagonal line b, the diagonal a is vertically bisected by the diagonal b, and a distance between the one end of the diagonal a and the diagonal b is equal to a distance between the other end of the diagonal a and the diagonal b. In FIG. 18, two adjacent sides of the quadrilateral in the row direction have the same length, and two adjacent sides of the quadrilateral in the column direction have different lengths. For example, the sides S1 and S2 have the same length, the sides S3 and S4 have the same length, while the sides S1 and S4 have different lengths, and the sides S2 and S3 have different lengths. As shown in FIG. 18, the length of the side S1 is greater than the length of the side S4, the length of the side S2 is greater than the length of the side S3, and the length of the first diagonal a is greater than the length of the second diagonal b. For example, the ratio of the length of the first diagonal line a to the length of the second diagonal line b is greater than 1 and less than or equal to 4. In some examples, the ratio of the length of the first diagonal line a to the length of the second diagonal line b may be equal to 2. In some examples, the ratio of the length of the first diagonal line a to the length of the second diagonal line b may be equal to 3.5.

With such an arrangement of the main post spacer, it is possible to avoid a case that a distance between adjacent main post spacers in a long-side direction is large and a distance between adjacent main post spacers in a short-side direction is small. In this way, the support of the main post spacers may be more uniform, the support ability of the main post spacers may be improved, so that a product quality may be improved.

It should be noted that specific values of the side length of the parallelogram formed by the plurality of main post spacers 51 and the length of the two diagonal lines of the parallelogram are related to a size and a resolution of an actual product, and may be designed based on actual parameters of the product.

Figure 4:
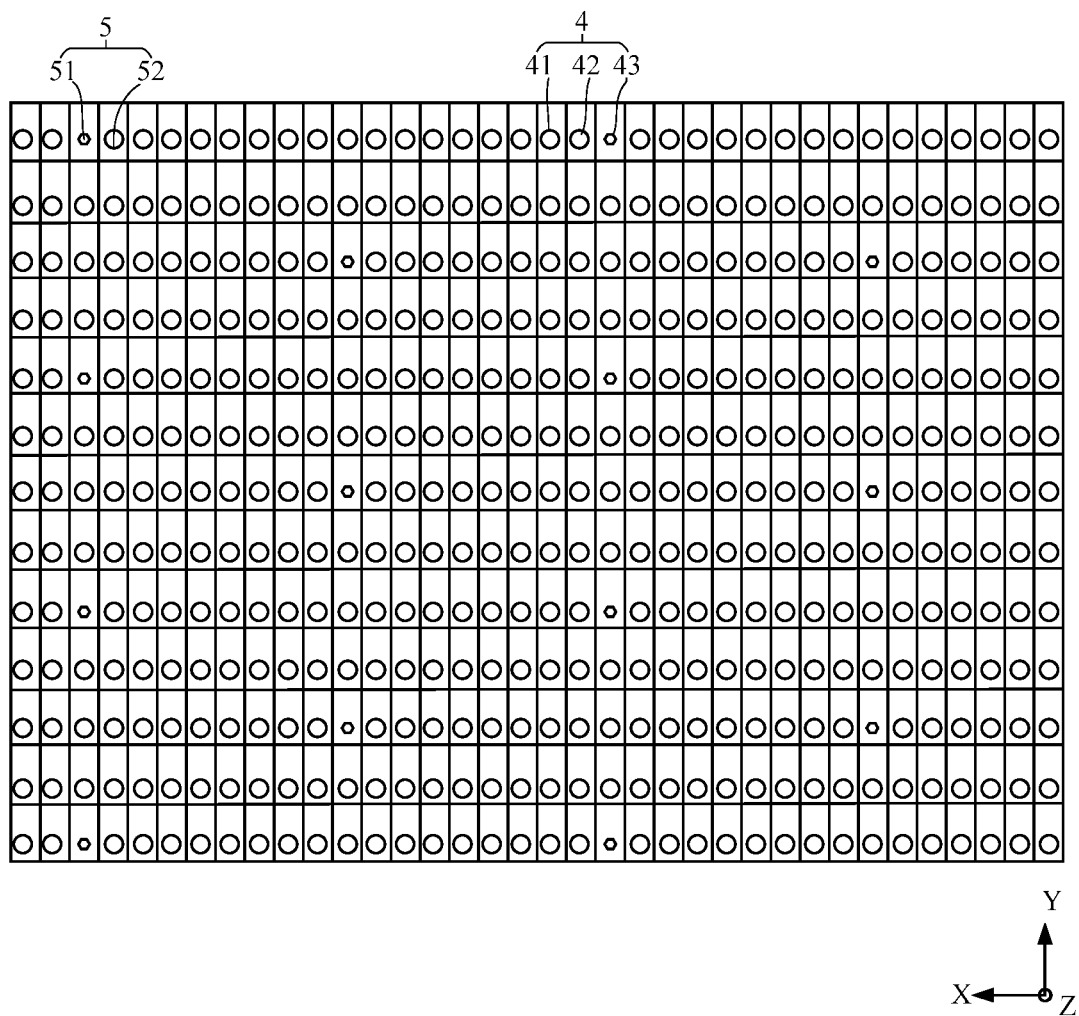
FIG. 4 shows a schematic plan view of a distribution of post spacers on a display panel according to other embodiments of the present disclosure.

FIG. 4 shows a schematic plan view of a distribution of the post spacers on the display panel according to other embodiments of the present disclosure. In the embodiment shown in FIG. 4, each sub-pixel 4 is provided with a post spacer 5 (one of the main post spacer 51 and the sub post spacer 52).

Referring back to FIG. 1, in a sub-pixel adjacent to the sub-pixel provided with the main post spacer 51, no post spacer 5 is provided, that is, neither the main post spacer 51 nor the sub post spacer 52 is provided.

Herein, for the convenience of description, the sub-pixel provided with the main post spacer 51 is referred to as a "main sub-pixel", the sub-pixel provided with the sub post spacer 52 is referred to as a "sub sub-pixel", and the sub-pixel provided with no post spacer 5 (neither the main post spacer 51 nor the sub post spacer 52 is provided) is referred to as a "mark sub-pixel". It should be understood that the main sub-pixel may be any one of the first sub-pixel 41, the second sub-pixel 42 and the third sub-pixel 43, the sub sub-pixel may be any one of the first sub-pixel 41, the second sub-pixel 42 and the third sub-pixel 43, and the mark sub-pixel may be any one of the first sub-pixel 41, the second sub-pixel 42 and the third sub-pixel 43. For example, the main sub-pixel may be the third sub-pixel 43, that is, the main post spacer 51 is arranged in the blue sub-pixel.

For example, as shown in FIG. 1 and FIG. 3, one main post spacer 51 is arranged in the third sub-pixel 43 (for example, the blue sub-pixel). According to the sub-pixel arrangement shown in FIG. 1 and FIG. 3, in the row direction X, two sub-pixels including a right first sub-pixel 41 (for example, the red sub-pixel) and a left second sub-pixel 42 (for example, the green sub-pixel) are arranged adjacent to the third sub-pixel 43; in the column direction Y, two sub-pixels including an upper third sub-pixel 43 and a lower third sub-pixel 43 are arranged adjacent to the third sub-pixel 43. Only one of the four sub-pixels is provided with no post spacer. For example, in the embodiment shown, only one second sub-pixel (for example, the green sub-pixel) adjacent to the third sub-pixel 43 provided with the main post spacer 51 is provided with no post spacer.

Herein, for the convenience of description, a sub-pixel 4 provided with a main post spacer 51, a plurality of sub-pixels 4 adjacent to the sub-pixel 4 in the row direction X, and a plurality of sub-pixels 4 adjacent to the sub-pixel 4 in the column direction Y are referred to as a sub-pixel group 4GR (for example, a sub-pixel group 4GR filled with crossed lines in FIG. 1). For example, according to the sub-pixel arrangement shown in FIG. 1 and FIG. 3, a sub-pixel group 4GR may include a third sub-pixel 43 provided with a main post spacer 51 and four sub-pixels adjacent to the third sub-pixel 43 (the sub-pixel 41 and the sub-pixel 42 adjacent to the sub-pixel 43 in the row direction X and two sub-pixels 43 adjacent to the sub-pixel 43 in the column direction Y).

In the embodiments of the present disclosure, the display panel may include a plurality of main post spacers 51 respectively arranged in the plurality of sub-pixels 4. One sub-pixel 4 is provided with at most one main post spacer 51. In this way, the display panel includes a plurality of sub-pixel groups 4GR, and each sub-pixel group 4GR includes a sub-pixel 4 in which a main post spacer 51 is located and a plurality of sub-pixels adjacent to the sub-pixel 4. Each sub-pixel group 4GR may include a mark sub-pixel 4 in which no post spacer 5 is provided (neither the main post spacer 51 nor the sub post spacer 52 is provided). Furthermore, in each sub-pixel group 4GR, except for the sub-pixel 4 provided with the main post spacer 51 (that is, the main sub-pixel) and the mark sub-pixel 4, the other sub-pixels 4 are all provided with the sub post spacers 52.

Referring to FIG. 1 and FIG. 3, a main post spacer 51 is adjacent to two sub post spacers 52 in the row direction X and adjacent to two sub post spacers 52 in the column direction Y, that is, the main post spacer 51 is adjacent to four sub post spacers 52. Since the mark sub-pixel provided with no post spacer 5 is arranged on the left side of the main sub-pixel, a separation distance between the main post spacer 51 and a left adjacent sub post spacer 52 is greater than that between the main post spacer 51 and a right adjacent sub post spacer 52, that is, as shown in FIG. 3, p1 is greater than p2. In other words, each main post spacer 51 is adjacent to two sub post spacers 52 in the row direction X, and in the post spacer group including the main post spacer 51 and the two sub post spacers 52 adjacent to the main post spacer 51 in the row direction X, a separation distance between the main post spacer 51 and one of the sub post spacers 52 is greater than that between the main post spacer 51 and the other of the sub post spacers 52.

For another example, each main post spacer 51 is adjacent to two sub post spacers 52 in the row direction X, and in the post spacer group including the main post spacer 51 and the two sub post spacers 52 adjacent to the main post spacer 51 in the row direction X, a separation distance between the main post spacer 51 and one of the sub post spacers 52 (the left adjacent post spacer in FIG. 1 and FIG. 3) is more than 2 times that between the main post spacer 51 and the other of the sub post spacers 52 (the right adjacent post spacer in FIG. 1 and FIG. 3), that is, p1 is greater than or equal to 2*p2.

It should be noted that in the embodiments in FIG. 1 and FIG. 3, a main post spacer 51 is adjacent to two sub post spacers 52 in the column direction Y. In the post spacer group including the main post spacer 51 and the two sub post spacers 52 adjacent to the main post spacer 51 in the column direction Y, a separation distance between the main post spacer 51 and one of the sub post spacers 52 (the upper adjacent post spacer in FIG. 1 and FIG. 3) is substantially equal to that between the main post spacer 51 and the other of the sub post spacers 52 (the lower adjacent post spacer in FIG. 1 and FIG. 3), which is denoted by a reference numeral p3 in FIG. 3. In the embodiments in FIG. 1 and FIG. 3, p3 is greater than p2.

Optionally, in the embodiments in FIG. 1 and FIG. 3, p3 is less than p2. It should be noted that the relationship between p1 and p3 may be set according to the size of the sub-pixel, and the embodiments of the present disclosure are not limited to this.

In the embodiments of the present disclosure, with such an arrangement of the post spacers, in particular by arranging a mark sub-pixel without any post spacer to be adjacent to the sub-pixel in which a main post spacer 51 is located, it is possible to accurately identify or detect the main post spacer by identifying or detecting the mark sub-pixel (to be described in detail below), and it is also possible to accurately identify or detect the sub post spacer, so that the purpose of accurately identifying or detecting two types of post spacers may be achieved. On this basis, a quality of the manufactured display product may be improved.

Optionally, referring to FIG. 1 and FIG. 3, a sub-pixel group 4GR includes only one mark sub-pixel 4. For example, in the plurality of sub-pixel groups 4GR in the display panel, the mark sub-pixels 4 are all located on the same side of the sub-pixels 4 provided with the main post spacers 51. For example, the mark sub-pixels 4 are all located on the left side of the sub-pixels 4 provided with the main post spacers 51. In this way, in the process of identifying or detecting the main post spacer, once the mark sub-pixel is detected, it is possible to quickly and accurately determine a position of the main post spacer, for example, on the right side of the mark sub-pixel. This may not only increase a speed of recognition or detection, but also achieve the purpose of accurately identifying or detecting the main post spacer.

In the embodiments of the present disclosure, by arranging the mark sub-pixel to be adjacent to the main post spacer, the main post spacer may be detected quickly and accurately without artificially increasing a size difference between the main post spacer and the sub post spacer, which may avoid a loss of light transmittance caused by artificially increasing the size of the main post spacer and which is conducive to the implementation of the manufacturing process.

Figure 19:
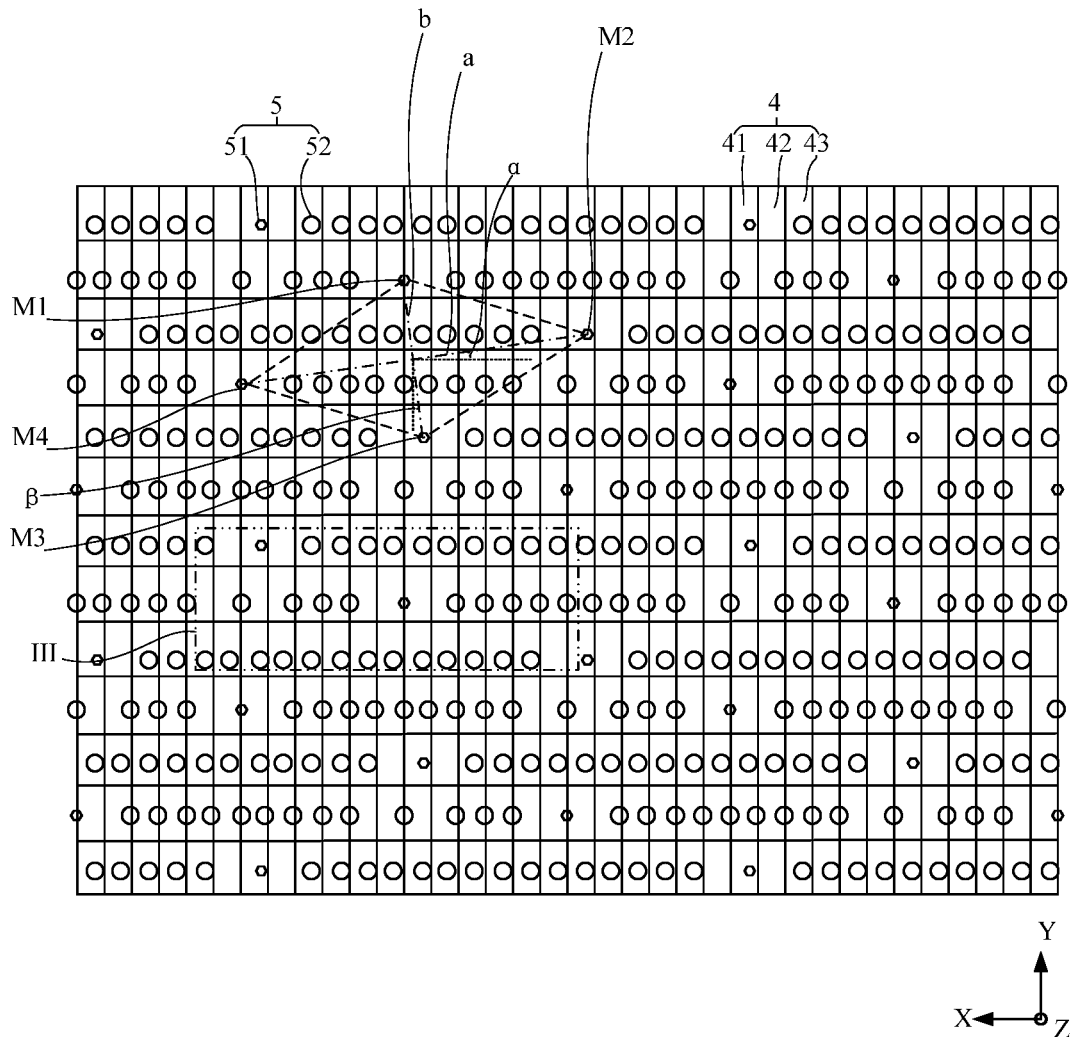
FIG. 19 shows a schematic plan view of a distribution of post spacers on a display panel according to other embodiments of the present disclosure.

FIG. 19 shows a schematic plan view of a distribution of post spacers on a display panel according to other embodiments of the present disclosure. In the embodiments of FIG. 19, the post spacer 5 may be provided in the sub-pixel 4, and the post spacer 5 may further be provided between two adjacent sub-pixels 4 in the row direction X. For example, some main post spacers 51 are provided in the first sub-pixel 41, some main post spacers 51 are provided between the first sub-pixel 41 and the third sub-pixel 43 adjacent to the first sub-pixel 41 in the row direction X. Some sub post spacers 52 are provided in the sub-pixels 4 (such as the first sub-pixel 41, the second sub-pixel 42, and the third sub-pixel 43), and some sub post spacers 52 are provided between two adjacent sub-pixels 4 in the row direction (for example, between the first sub-pixel 41 and the second sub-pixel 42, between the first sub-pixel 41 and the third sub-pixel 43, and between the second sub-pixel 42 and the third sub-pixel 43 which are adjacent to each other in the row direction X).

As shown in FIG. 19, when the main post spacer 51 is provided in the first sub-pixel 41, there is no post spacer 5 in the third sub-pixel 43 adjacent to the first sub-pixel 41, and there is no post spacer 5 in the second sub-pixel 42 adjacent to the first sub-pixel 41. When the main post spacer 51 is provided between the first sub-pixel 41 and the third sub-pixel 43 which is adjacent to the first sub-pixel 41 in the row direction X, there is no post spacer 5 between the first sub-pixel 41 and the second sub-pixel 42 adjacent to the first sub-pixel 41, and there is no post spacer 5 between the third sub-pixel 43 and the second sub-pixel 42 adjacent to the third sub-pixel 43.

For example, as shown in FIG. 19, main post spacers M1, M2, M3 and M4 are four main post spacers 51 adjacent in the row direction X and the column direction Y, which are located in four adjacent rows of the sub-pixels. The four main post spacers are arranged in a quadrilateral. The main post spacers M1 and M4 are both arranged between the first sub-pixel 41 and the third sub-pixel 43 adjacent to the first sub-pixel 41, and the main post spacers M2 and M3 are both arranged in the first sub-pixel 41. A geometric center of the main post spacers M1 and M3 have a second deviation direction (i.e. left direction in FIG. 19) and a first deviation direction (i.e. right direction in FIG. 19) respectively with respect to a geometric center of the first sub-pixels 41 where the post spacers M1 and M3 are located. The main post spacers M2 and M4 tend to expand the quadrilateral outwardly (that is, the main post spacer M2 has a right deviation direction with respect to the first sub-pixel 41, and the main post spacer M4 has a left deviation with respect to the first sub-pixel 41). For example, in FIG. 19, a length of each sub-pixel 4 may be 49 um in the row direction X, and a length of each sub-pixel 4 may be 147 um in the column direction Y. A deviation between M1 and M3 in the quadrilateral may have a range of 0.1-0.3 um in the row direction X. The quadrilateral includes a first diagonal a and a second diagonal b, the main post spacers M2 and M4 are respectively located at both ends of the first diagonal a, and the main post spacers M1 and M3 are respectively located at both ends of the second diagonal b. The length of the first diagonal a is greater than the length of the second diagonal b. An angle between the first diagonal a and the row direction X is a first acute angle ($\alpha$ in FIG. 19), and the second diagonal b is substantially parallel to the column direction Y. Optionally, there may be a second acute angle between the second diagonal b and the column direction Y ($\beta$ in FIG. 19), and the second acute angle is smaller than the first acute angle.

The sub post spacer 52 has the same deviation direction as the main post spacer 51 in the same row. For example, a geometric center of the sub post spacer 52 in the same row as the main post spacer M1 has a left deviation relative to the geometric center of the sub-pixel 4, and each sub post spacer 52 in this row is located between two sub-pixels 4. A geometric center of the sub post spacer 52 in the same row as the main post spacer M2 has a right deviation relative to the geometric center of the sub-pixel 4, and each sub post spacer 52 in this row is located in a sub-pixel 4. A geometric center of the sub post spacer 52 in the same row as the main post spacer M4 has a left deviation relative to the geometric center of the sub-pixel 4, and each sub post spacer 52 in this row is located between two sub-pixels 4. A geometric center of the sub post spacer 52 in the same row as the main post spacer M3 has a right deviation relative to the geometric center of the sub-pixel 4, and each sub post spacer 52 in this row is located in a sub-pixel 4.

With reference to FIG. 19, one main post spacer 51 is adjacent to two sub post spacers 52 in the row direction X. There are areas on both sides of the main post spacer 51 that are not provided with any spacer 5, and a distance between the main post spacer 51 and the sub post spacer 52 adjacent to the left side of the main post spacer 51 is the same as a distance between the main post spacer 51 and the sub post spacer 52 adjacent to the right side of the main post spacer 51.

Figure 20:
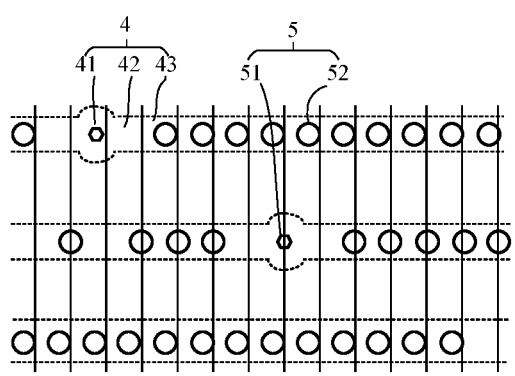
FIG. 20 shows a partial enlarged view of part III in FIG. 19.

FIG. 20 shows a partial enlarged view of part III in FIG. 19. According to the embodiments of the present disclosure, the display substrate further includes a black matrix. As shown in FIG. 20, dotted lines on both sides of the spacers 5 in the same row represent an outline of the corresponding black matrix. An orthographic projection of the black matrix on the base substrate is a plurality of strips that extend in the row direction and are arranged in the column direction. Each strip includes a first area overlapping an orthographic projection of the main post spacer 51 on the base substrate and a second area overlapping an orthographic projection of the sub post spacer 52 on the base substrate. A size of the first area in the column direction is greater than a size of the second area in the column direction, an edge of the first area expands in a circular arc shape in the second direction, and the main post spacer 51 is located at a center of the first area (that is, distances of the main post spacer 51 to the outlines on both sides are roughly equal).

In the embodiments of the present disclosure, by arranging the post spacers as described above, two areas adjacent to the sub-pixel where each main spacer 51 is located are provided with no spacers. Thus, in the process of identifying or detecting the main spacer, the main post spacer may be detected quickly and accurately by identifying these areas, and it is also possible to accurately identify or detect the sub post spacer, so that the purpose of accurately identifying or detecting two types of post spacers may be achieved without artificially increasing a size difference between the main post spacer and the sub post spacer, which may avoid a loss of light transmittance caused by artificially increasing the size of the main post spacer and which is conducive to the implementation of the manufacturing process.

In the embodiments of the present disclosure, each of the main post spacer 51 and the sub post spacer 52 may be a columnar post spacer.

Figure 5A:
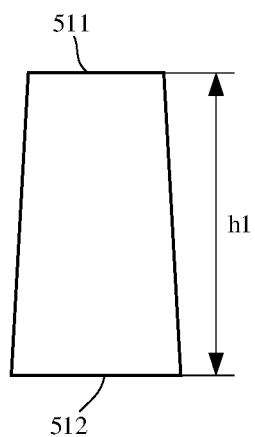
FIG. 5A and FIG. 5B respectively show a side view and a top view of the post spacer included in the display panel according to some embodiments of the present disclosure.
Figure 5B:
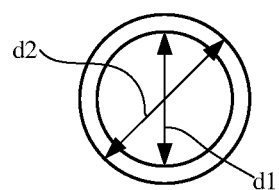

Referring to FIG. 5A and FIG. 5B, each of the main post spacer 51 and the sub post spacer 52 may have a shape of a circular truncated cone. For example, the main post spacer 51 may have a top surface 511 and a bottom surface 512. Each of the top surface 511 and the bottom surface 512 has an outer contour of a circular shape. A diameter d1 of the top surface 511 is less than a diameter d2 of the bottom surface 512. The main post spacer 51 may have a height h1. For another example, similarly, the sub post spacer 52 may have a top surface and a bottom surface. Each of the top surface and the bottom surface has an outer contour of a circular shape. The top surface has a diameter less than that of the bottom surface. The sub post spacer 52 may have a height less than the height h1. For example, dimensions of the circular truncated cone-shaped main post spacer 51 and sub post spacer 52 may be referred to Table 1.

TABLE 1

|  | Main PS | Sub PS |
| --- | --- | --- |
| Diameter of top surface (μm) | 11 | 9.5 |
| Diameter of bottom surface (μm) | 19 | 19 |
| Height (μm) | 3.05 | 2.55 |

Figure 6A:
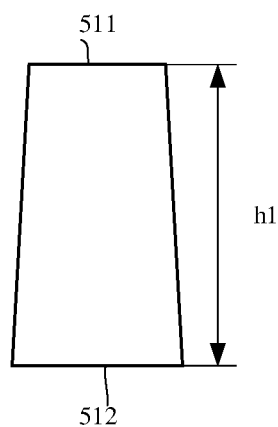
FIG. 6A and FIG. 6B respectively show a side view and a top view of the post spacer included in the display panel according to other embodiments of the present disclosure.
Figure 6B:
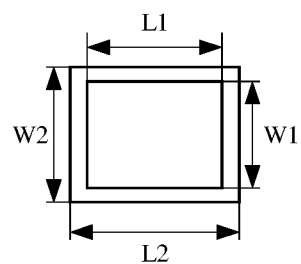

Referring to FIG. 6A and FIG. 6B, each of the main post spacer 51 and the sub post spacer 52 may have a shape of a trustum of a pyramid. For example, each of the top surface 511 and the bottom surface 512 of the main post spacer 51 may have an outer contour of a rectangular shape. The top surface 511 may have a length L1 and a width W1, and the bottom surface 512 may have a length L2 and a width W2. For another example, similarly, each of the top surface and the bottom surface of the sub post spacer 52 may have an outer contour of a rectangular shape. For example, dimensions of the main post spacer 51 and sub post spacer 52, which have the shapes of the trustum of a pyramid, may be referred to Table 2.

TABLE 2

|  | Main PS | Sub PS |
| --- | --- | --- |
| Length * width of top surface (μm) | 18 * 16 | 16 * 14 |
| Length * width of bottom surface (μm) | 25 * 23 | 25 * 23 |
| Height (μm) | 3.05 | 2.55 |

Figure 21A:
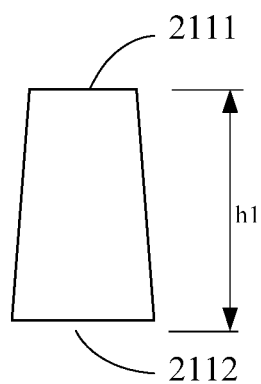
FIG. 21A and FIG. 22B respectively show a side view and a top view of the post spacer included in the display panel according to some embodiments of the present disclosure.
Figure 21B:
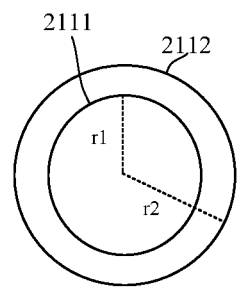
Figure 22A:
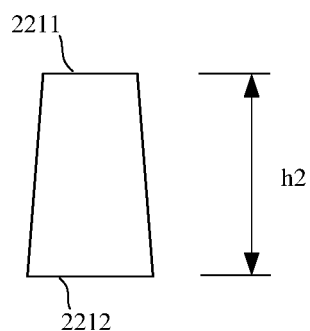
Figure 22B:
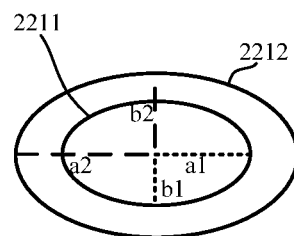

Referring to FIG. 21A and FIG. 21B, the main post spacer 51 may have a shape of a circular truncated cone. For example, the main post spacer 51 may have a top surface 2111 and a bottom surface 2112. Each of the top surface 2111 and the bottom surface 2112 has an outer contour of a circular shape. A radius r1 of the top surface 2111 is less than a radius r2 of the bottom surface 2112. The main post spacer 51 may have a height h1. Referring to FIG. 22A and FIG. 22B, the sub post spacer 52 may have a top surface 2211 and a bottom surface 2212. Each of the top surface 2211 and the bottom surface 2212 has an outer contour of an oval shape. A semi-major axis a1 and a semi-minor axis b1 of the top surface 2211 are respectively less than a semi-major axis a2 and a semi-minor axis b2 of the bottom surface 2212. The sub post spacer 52 may have a height h2 less than the height h1. For example, dimensions of the main post spacer 51 and sub post spacer 52 may be referred to Table 3.

TABLE 3

|  | Main PS | Sub PS |
| --- | --- | --- |
| Projection size (μm) | Radius: 16 | Semi-major axis: 25 Semi-minor axis: 18 |
| Height (μm) | 3.05 | 2.55 |

Figure 7:
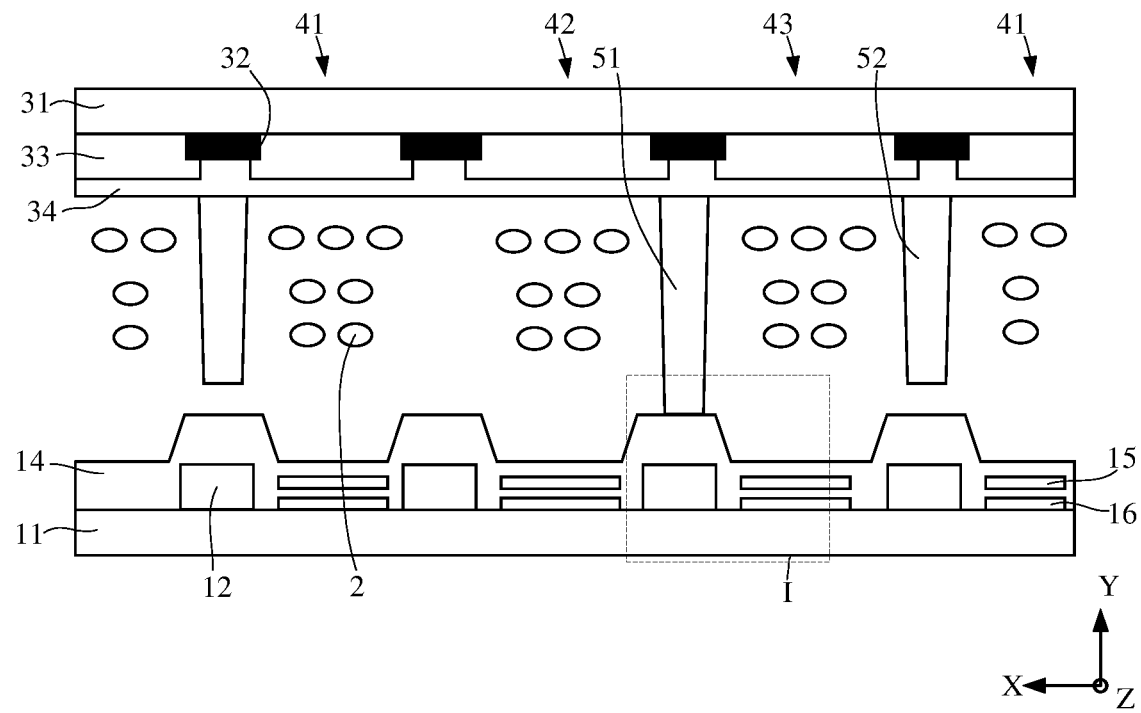
FIG. 7 shows a cross-sectional view of the display panel according to some exemplary embodiments of the present disclosure taken along line AA' in FIG. 3.
Figure 8:
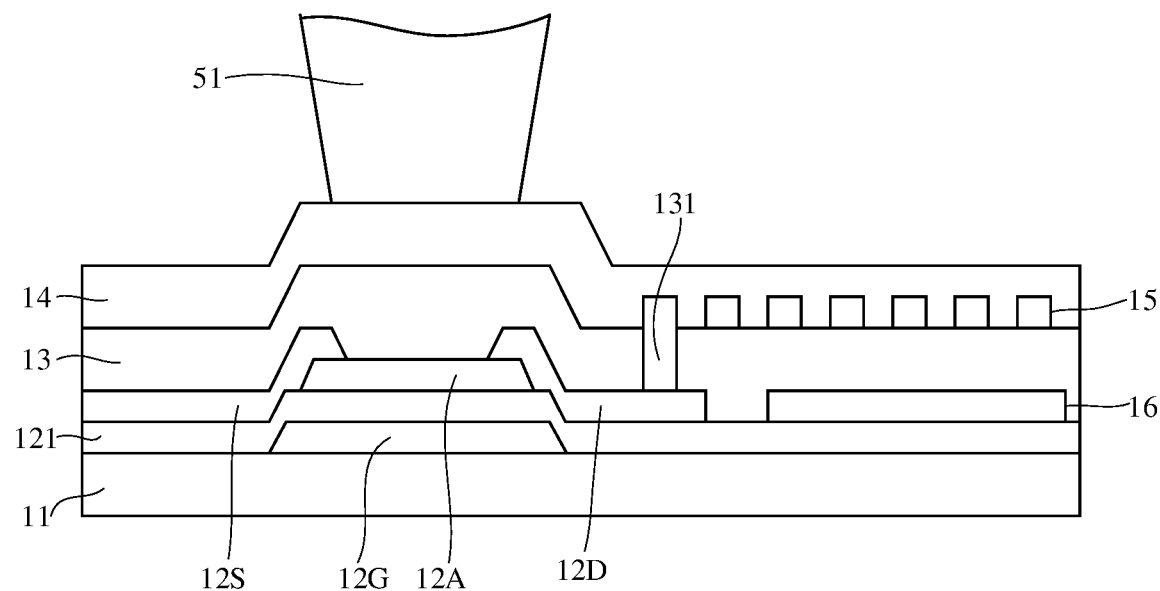
FIG. 8 shows a partial enlarged view of part I in FIG. 7.

FIG. 7 shows a cross-sectional view of the display panel according to some exemplary embodiments of the present disclosure taken along line AA' in FIG. 3. FIG. 8 shows a partial enlarged view of part I in FIG. 7. It should be noted that the display panel according to the embodiments of the present disclosure may be applied to display devices of various modes, such as TN (Twisted Nematic) mode, VA (Vertical Alignment) mode, ADS (ADvanced Super Dimension Switch) mode, and so on. For example, the display panel may be a touch display panel.

In the following description, the ADS mode is illustrated by way of example in describing the structure of the display panel according to the embodiments of the present disclosure.

In the ADS mode, an electric field generated by edges of slit electrodes in the same plane and an electric field generated between a slit electrode layer and a plate electrode layer may form a multi-dimensional electric field, so that all liquid crystal molecules between the slit electrodes and directly above the electrodes in the liquid crystal cell can rotate, thereby improving an operation efficiency of the liquid crystal and increasing the light transmission efficiency.

Herein, each of the first substrate 1 and the second substrate 3 may be referred to as a display substrate. For example, the first substrate 1 may be one of an array substrate and a color filter substrate, and the second substrate 3 may be the other of the array substrate and the color filter substrate. Referring to FIG. 2 and FIG. 7 in combination, the first substrate 1 may be an array substrate, and the second substrate 3 may be a color filter substrate.

Referring to FIG. 7, the first substrate 1 may include a first base substrate 11, a thin film transistor 12, a first electrode 15 and a second electrode 16. The thin film transistor 12, the first electrode 15 and the second electrode 16 are all arranged on the first base substrate 11.

For example, the thin film transistor 12 may be a bottom gate thin film transistor. Referring to FIG. 7 and FIG. 8, the thin film transistor 12 may include a gate electrode 12G, a source electrode 12S, a drain electrode 12D and an active layer 12A. Specifically, the gate electrode 12G is arranged on the first base substrate 11. A gate insulating layer 121 is located on a side of the gate electrode 12G away from the first base substrate 11, and covers the gate electrode 12G. The active layer 12A is located on a side of the gate insulating layer 121 away from the first base substrate 11. The source electrode 12S and the drain electrode 12D are located on a side of the active layer 12A away from the first base substrate 11 and are located in the same layer, and the source electrode 12S and the drain electrode 12D are each in contact with a respective end of the active layer 12A.

The array substrate 1 may further include a first insulating layer 13 and a second insulating layer 14. The first insulating layer 13 is located on a side of the source electrode 12S and the drain electrode 12D away from the first base substrate 11, and covers the thin film transistor 12 and the second electrode 16. The second insulating layer 14 is located on a side of the first electrode 15 away from the first base substrate 11, and covers the thin film transistor 12, the first electrode 15 and the second electrode 16.

For example, the first electrode 15 may be a slit electrode in the ADS display mode, and may serve as a pixel electrode. The second electrode 16 may be a plate electrode in the ADS display mode, and may serve as a common electrode. The first electrode 15 is located above the second electrode 16, and the first insulating layer 13 is located between the two electrodes. In the ADS display mode, an electric field generated by edges of slit electrodes (that is, the first electrode 15) in the same plane and an electric field generated between a slit electrode layer (that is, the layer in which the first electrode 15 is located) and a plate electrode layer (that is, the layer in which the second electrode 16 is located) may form a multi-dimensional electric field, so that all liquid crystal molecules between the slit electrodes and directly above the electrodes in the liquid crystal cell can rotate, thereby improving the operation efficiency of the liquid crystal and increasing the light transmission efficiency.

Referring to FIG. 8, the first electrode 15 may be electrically connected to the drain electrode 12D of the thin film transistor 12 through a via hole 131 formed in the first insulating layer 13, so that the thin film transistor 12 may provide a given voltage to the first electrode 15.

Referring to FIG. 7, the color filter substrate 3 may include a second base substrate 31, a black matrix 32, a color filter layer 33 and a cover layer 34. The black matrix 32, the color filter layer 33 and the cover layer 34 are all arranged on the second base substrate 31. The cover layer 34 is arranged on a side of the color filter layer 33 away from the second base substrate 31 so as to protect the color filter layer 33 and produce a planarization effect.

It should be understood that the color filter layer 33 may include a filter in each sub-pixel. For example, the color filter layer 33 includes a first filter (for example, a red filter) in the first sub-pixel 41, the color filter layer 33 includes a second filter (for example, a green filter) in the second sub-pixel 42, and the color filter layer 33 includes a third filter (for example, a blue filter) in the third sub-pixel 43.

The color filter substrate 3 may further include a plurality of post spacers 5 described above. That is, the plurality of post spacers 5 (including the main post spacer 51 and the sub post spacer 52) are arranged on the second base substrate 31, specifically on a side of the cover layer 34 away from the second base substrate 31. Accordingly, the post spacer 5 is located between the array substrate 1 and the color filter substrate 3 so as to maintain a cell gap of the liquid crystal cell.

As shown in FIG. 7, an orthographic projection of each post spacer 5 on the second base substrate 31 falls within an orthographic projection of the black matrix 32 on the second base substrate 31. In addition, an orthographic projection of each post spacer 5 on the first base substrate 11 overlaps an orthographic projection of the thin film transistor 12 on the first base substrate 11. For example, the orthographic projection of each post spacer 5 on the first base substrate 11 falls within the orthographic projection of the thin film transistor 12 on the first base substrate 11. More specifically, the orthographic projection of each post spacer 5 on the first base substrate 11 falls within an orthographic projection of the gate electrode 12G of the thin film transistor 12 on the first base substrate 11. With such an arrangement, the post spacers may not affect the light transmittance of the sub-pixels, so as to avoid affecting the light transmittance of the sub-pixels. In addition, in the embodiments of the present disclosure, since each post spacer is placed above the thin film transistor, there is no need to provide an additional raised structure to make up the height, which is beneficial to simplify the structure and save the steps of the manufacturing process.

In the embodiment of FIG. 7, the main post spacer 51 is provided in the third sub-pixel 43. The sub-pixel (the second sub-pixel 42 in FIG. 7) located on a side (the left side in FIG. 7) of the third sub-pixel 43 is the mark sub-pixel described above, which is provided with no post spacer 5. Therefore, in the embodiment of FIG. 7, the first sub-pixel 41, the second sub-pixel 42, the third sub-pixel 43 and the first sub-pixel 41 arranged from left to right are respectively provided with a sub post spacer 52, no post spacer, a main post spacer 51 and a sub post spacer 52. In this way, the main post spacer 51 may be accurately identified or detected by identifying or detecting the mark sub-pixel 42.

In the embodiments of the present disclosure, the green sub-pixel 42 is formed as the mark sub-pixel, that is, no post spacer is provided in the green sub-pixel 42 adjacent to the sub-pixel provided with the main post spacer 51. The light transmittance of the green filter is greater than that of the red filter and the blue filter. Since there is no need to provide post spacers in part of the green sub-pixels 42, there is no need to increase a width of the black matrix at the green sub-pixels. In this way, an aperture ratio of the green sub-pixel 42 may be increased, so that an overall light transmittance of the display panel may be improved.

Figure 9:
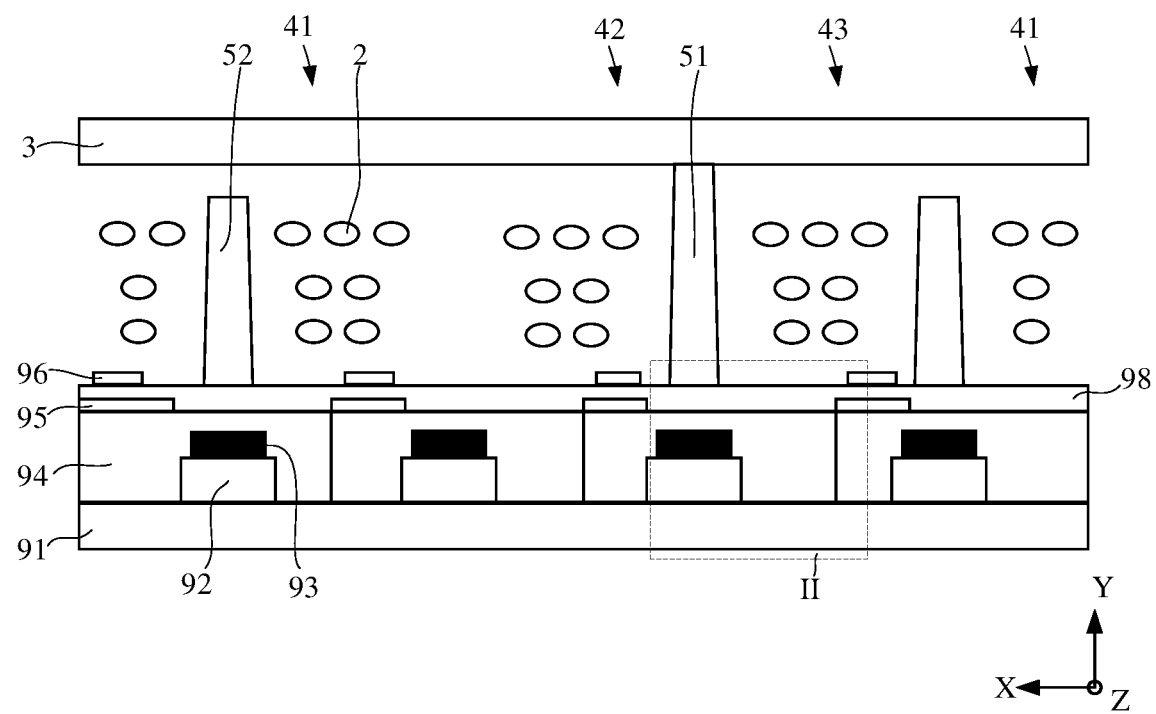
FIG. 9 shows a cross-sectional view of the display panel according to some exemplary embodiments of the present disclosure taken along line AA' in FIG. 3.
Figure 10:
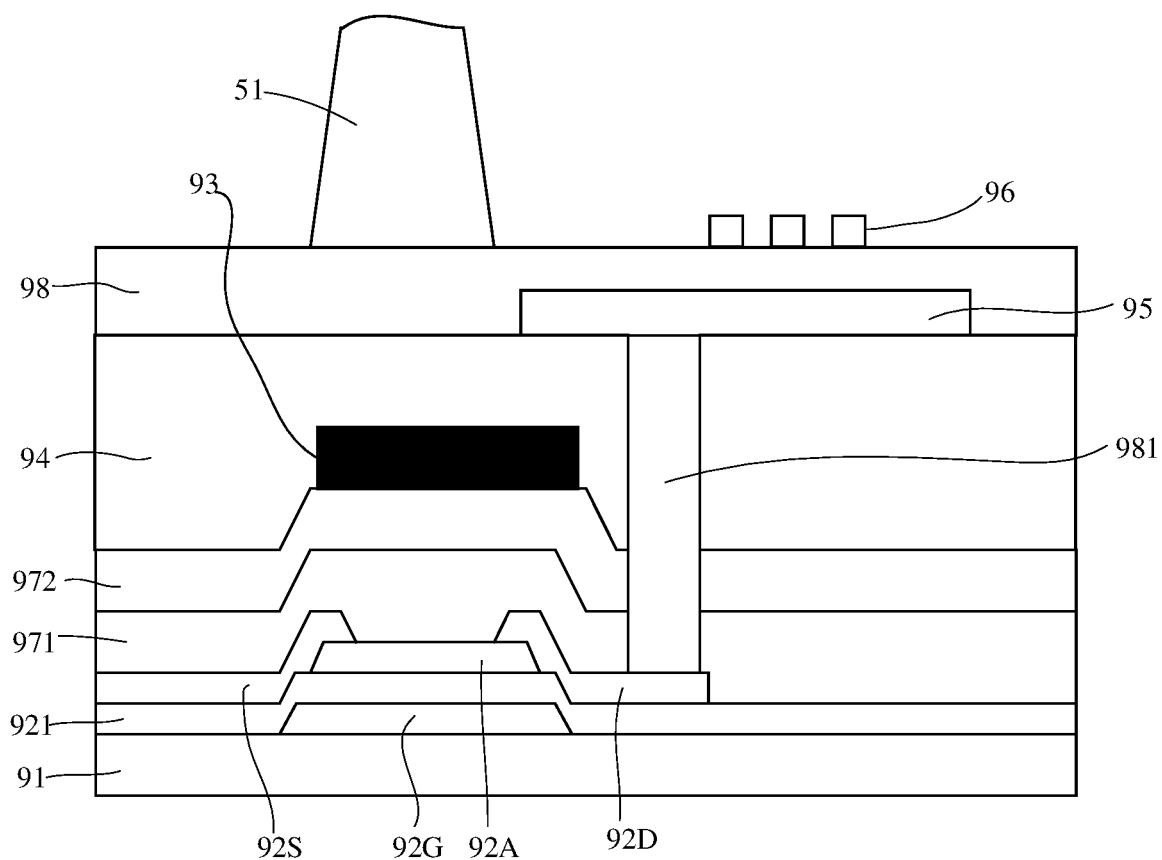
FIG. 10 shows a partial enlarged view of part II in FIG. 9.

FIG. 9 shows a cross-sectional view of the display panel according to some exemplary embodiments of the present disclosure taken along line AA' in FIG. 3. FIG. 10 shows a partial enlarged view of part II in FIG. 9. It should be noted that FIG. 9 and FIG. 10 show exemplary cross-sectional views of a display panel with a COA structure. Here, the COA structure is only illustrated by way of example in describing the embodiments of the present disclosure in detail, and it does not mean that the embodiments of the present disclosure are limited to the COA structure.

The COA structure refers to a structure in which the structure of the color filter substrate is integrated on the array substrate, which is called a Color Filter on Array. Specifically, in the array substrate of the COA structure, the black matrix and the color filter are arranged on the array substrate. Through such a design, it is possible to prevent a deviation during the alignment of the array substrate and the color filter substrate from affecting the aperture ratio of the display device and causing a light leakage, so that the quality of the display product may be improved.

Referring to FIG. 2 and FIG. 9 in combination, the first substrate 1 may be a COA array substrate, and the second substrate 3 may be a substrate opposite to the COA array substrate.

As shown in FIG. 9, the COA array substrate 1 may include a base substrate 91, a thin film transistor 92, a black matrix 93, a color filter layer 94, a first electrode 95 and a second electrode 96. The thin film transistor 92, the black matrix 93, the color filter layer 94, the first electrode 95 and the second electrode 96 are all arranged on the base substrate 91.

Referring to FIG. 9 and FIG. 10 in combination, the thin film transistor 92 may be a bottom gate thin film transistor. For example, the thin film transistor 92 may include a gate electrode 92G, a source electrode 92S, a drain electrode 92D and an active layer 92A. Specifically, the gate electrode 92G is arranged on the base substrate 91. A gate insulating layer 921 is located on a side of the gate electrode 92G away from the base substrate 91, and covers the gate electrode 92G. The active layer 92A is located on a side of the gate insulating layer 921 away from the base substrate 91. The source electrode 92S and the drain electrode 92D are located on a side of the active layer 92A away from the base substrate 91 and are located in the same layer, and the source electrode 92S and the drain electrode 92D are each in contact with a respective end of the active layer 92A.

The COA array substrate 1 may further include a passivation layer and a planarization layer 98. The passivation layer is provided on a side of the source electrode 92S and the drain electrode 92D away from the base substrate 91, so as to cover the thin film transistor 92. For example, the passivation layer may include a first passivation layer 971 and a second passivation layer 972.

The black matrix 93 is located on a side of the passivation layer 92 away from the base substrate 91. The color filter layer 94 is arranged on a side of the black matrix 93 away from the base substrate 91 and covers the black matrix 93. The first electrode 95 is arranged on a side of the color filter layer 94 away from the base substrate 91 and is connected to the drain electrode 92D of the thin film transistor 92 through a via hole 981. The planarization layer 98 is arranged on a side of the first electrode 95 away from the base substrate 91, and covers the color filter layer 94 and the first electrode 95. The second electrode 96 is arranged on the planarization layer 98.

The COA array substrate 1 may further include a plurality of post spacers 5 described above. That is, the plurality of post spacers 5 (including the main post spacer 51 and the sub post spacer 52) are arranged on the base substrate 91, specifically on a side of the planarization layer 98 away from the base substrate 91. Accordingly, the post spacer 5 is located between the COA array substrate 1 and the substrate 3 so as to maintain a cell gap of the liquid crystal cell.

Referring to FIG. 9 and FIG. 10, an orthographic projection of each post spacer 5 on the base substrate 91 falls within an orthographic projection of the black matrix 93 on the base substrate 91. In addition, the orthographic projection of each post spacer 5 on the base substrate 91 overlaps an orthographic projection of the thin film transistor 92 on the base substrate 91. For example, the orthographic projection of each post spacer 5 on the base substrate 91 falls within the orthographic projection of the thin film transistor 92 on the base substrate 91. More specifically, the orthographic projection of each post spacer 5 on the base substrate 91 falls within an orthographic projection of the gate electrode 92G of the thin film transistor 92 on the base substrate 91. With such an arrangement, the post spacers may not affect the light transmittance of the sub-pixels, so as to avoid affecting the light transmittance of the sub-pixels.

In the embodiment of FIG. 9, the main post spacer 51 is provided in the third sub-pixel 43. The sub-pixel (the second sub-pixel 42 in FIG. 9) located on a side (the left side in FIG. 9) of the third sub-pixel 43 is the mark sub-pixel described above, which is provided with no post spacer 5. Therefore, in the embodiment of FIG. 9, the first sub-pixel 41, the second sub-pixel 42, the third sub-pixel 43 and the first sub-pixel 41 arranged from left to right are respectively provided with a sub post spacer 52, no post spacer, a main post spacer 51 and a sub post spacer 52. In this way, the main post spacer 51 may be accurately identified or detected by identifying or detecting the mark sub-pixel 42.

Figure 11:
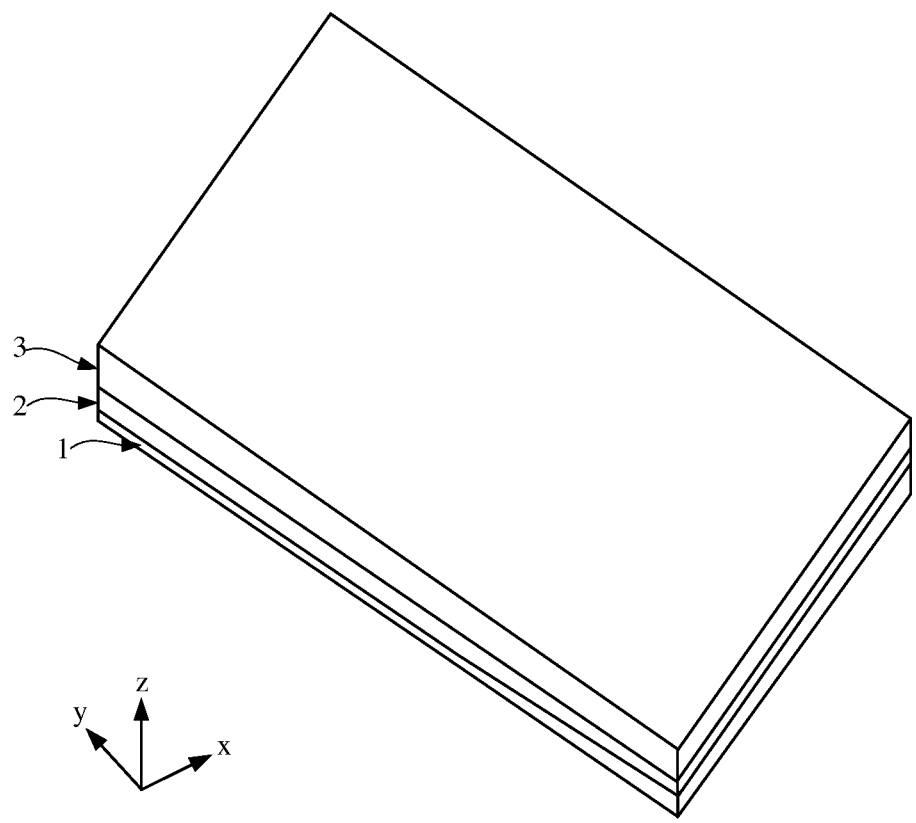
FIG. 11 shows a schematic diagram of a display device according to some exemplary embodiments of the present disclosure.

Referring to FIG. 11, according to the exemplary embodiments of the present disclosure a display device 100 that may include the display panel described above is further provided. Examples of the display device include a tablet personal computer (PC), a smart phone, a personal digital assistant (PDA), a portable multimedia player, a game console, or a wrist watch-type electronic device, etc. However, the embodiments of the present disclosure are not intended to limit the type of the display device 100. In some exemplary embodiments, the display device 100 may be used not only in a large electronic device such as a television (TV) or an external billboard, but also in a medium or small electronic device such as a PC, a notebook computer, a vehicle navigation device or a camera.

Figure 12:
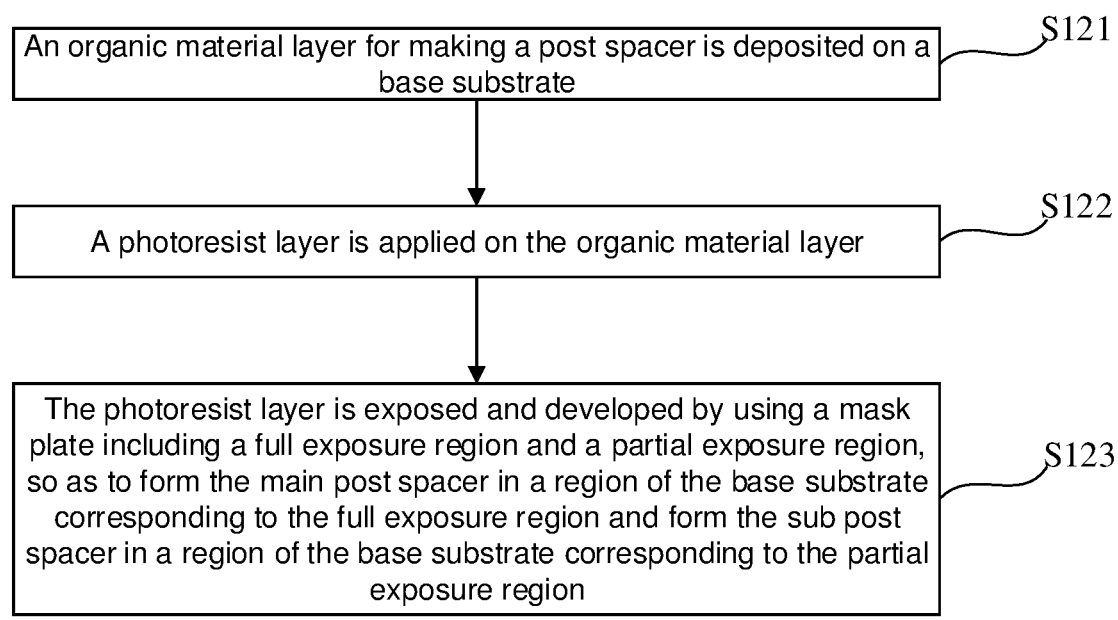
FIG. 12 shows a flowchart of a method of manufacturing a post spacer according to some exemplary embodiments of the present disclosure.

Referring to FIG. 12, according to the exemplary embodiments of the present disclosure a method of manufacturing a post spacer is further provided, which is used to manufacture the post spacer on a base substrate. It should be noted that the base substrate may be a base substrate of a color filter substrate or a base substrate of an array substrate. In order to highlight critical points, the process steps of manufacturing the post spacer will be described in detail below. The process steps of forming other structures of the array substrate or the color filter substrate on the base substrate may be referred to existing method of manufacturing an array substrate or a color filter substrate. Hereinafter, the method will be further described with reference to FIG. 12 and FIG. 13.

In step S121, an organic material layer 5' for making a post spacer is deposited on a base substrate 121. For example, the organic material may be polyacrylic resin or polyester resin, etc., which is not limited in the embodiments of the present disclosure.

In step S122, a photoresist layer 126 is applied on the organic material layer 5'.

In step S123, the photoresist layer 126 is exposed and developed by using a mask plate 127 including a full exposure region 1271 and a partial exposure region 1272, so as to form the main post spacer 51 in a region of the base substrate 121 corresponding to the full exposure region 1271 of the mask plate 127 and form the sub post spacer 52 in a region of the base substrate 121 corresponding to the partial exposure region 1272 of the mask plate 127.

Figure 13:
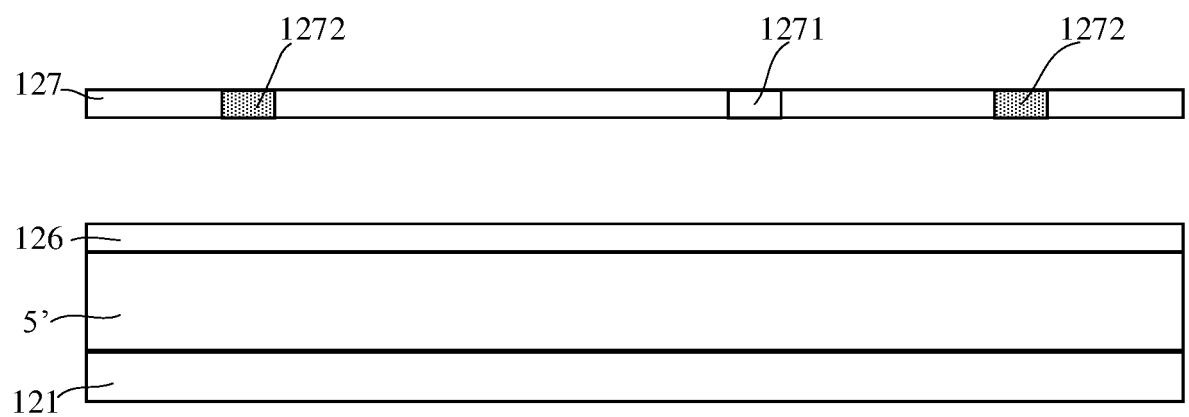
FIG. 13 shows a schematic diagram in which a patterning process of the method of manufacturing the post spacer is schematically shown.

Specifically, as shown in FIG. 13, the photoresist layer 126 is exposed and developed by using the mask plate 127 including the full exposure region 1271 and the partial exposure region 1272. After that, a process such as etching may be performed to form the main post spacer 51 in the region of the base substrate 121 corresponding to the full exposure region 1271 of the mask plate 127 and form the sub post spacer 52 in the region of the base substrate 121 corresponding to the partial exposure region 1272 of the mask plate 127. That is, on the base substrate, the main post spacer 51 may be formed in the region corresponding to each full exposure region 1271 of the mask plate 127, and the sub post spacer 52 may be formed in the region corresponding to each partial exposure region 1272 of the mask plate 127. In addition, it may be understood that the above are only examples provided in the present disclosure. In addition to the above methods, other patterning processes may also be used to form the main post spacer and the sub post spacer on the array substrate or the color filter substrate.

Figure 14:
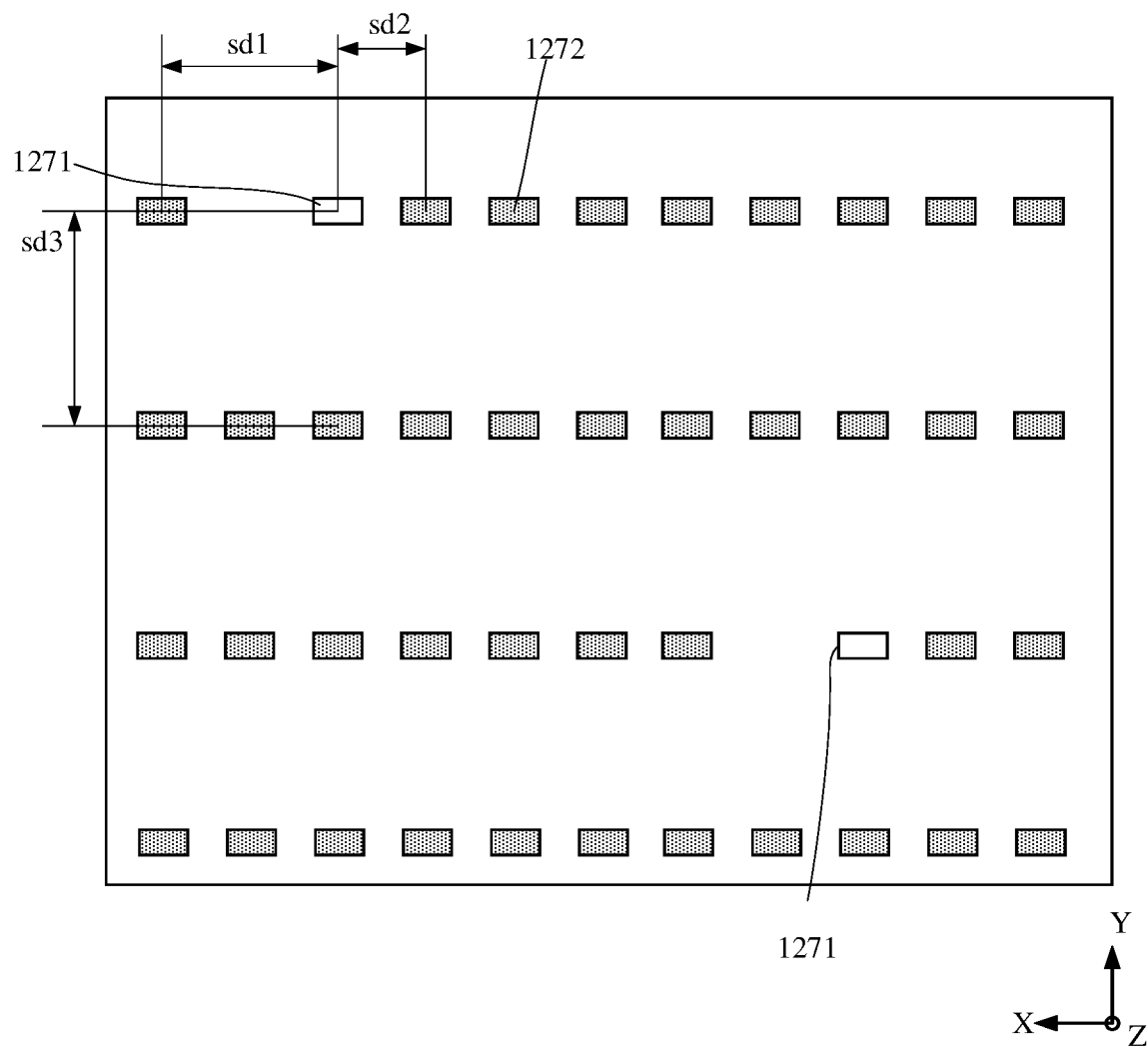
FIG. 14 shows a partial plan view of a mask plate used in the patterning process of the method of manufacturing the post spacer according to some exemplary embodiments of the present disclosure.

FIG. 14 shows a plan view of the mask plate used in the method of manufacturing the post spacer according to some embodiments of the present disclosure. Referring to FIG. 13 and FIG. 14 in combination, the mask plate 127 may include a plurality of full exposure regions 1271 and a plurality of partial exposure regions 1272, which are spaced apart from each other. As described above, the main post spacer 51 may be formed in the region corresponding to the full exposure region 1271, and the sub post spacer 52 may be formed in the region corresponding to the partial exposure region 1272. In the plan view shown in FIG. 14, in the row direction and the column direction, four partial exposure regions 1272 are arranged adjacent to a full exposure region 1271, and one partial exposure region 1272 is separated from the full exposure region 1271 by a large distance. For example, a distance between the full exposure region 1271 and a left partial exposure region 1272 is sd1, a distance between the full exposure region 1271 and a right partial exposure region 1272 is sd2, a distance between the full exposure region 1271 and an upper partial exposure region 1272 is sd3, and a distance between the full exposure region 1271 and a lower partial exposure region 1272 is sd3, sd1>sd2. In other words, in each group including the full exposure region 1271 and two partial exposure regions 1272 adjacent to the full exposure region in the row direction X, a distance between the full exposure region 1271 and one of the partial exposure regions 1272 is greater than a distance between the full exposure region 1271 and the other of the partial exposure regions 1272. For another example, sd1 is about more than 2 times sd2, that is, sd1 is greater than or equal to 2*sd2. With the mask designed in this way, a sub-pixel adjacent to the sub-pixel in which the main post spacer formed is located may be formed as the mark sub-pixel described above, in which no post spacer is formed.

In the embodiment in FIG. 14, sd3 is greater than sd2. Optionally, in the embodiment in FIG. 14, sd1 is less than sd3. It should be noted that the relationship between sd1 and sd3 may be set according to the size of the sub-pixel to be formed, and the embodiments of the present disclosure are not limited to this.

Figure 15:
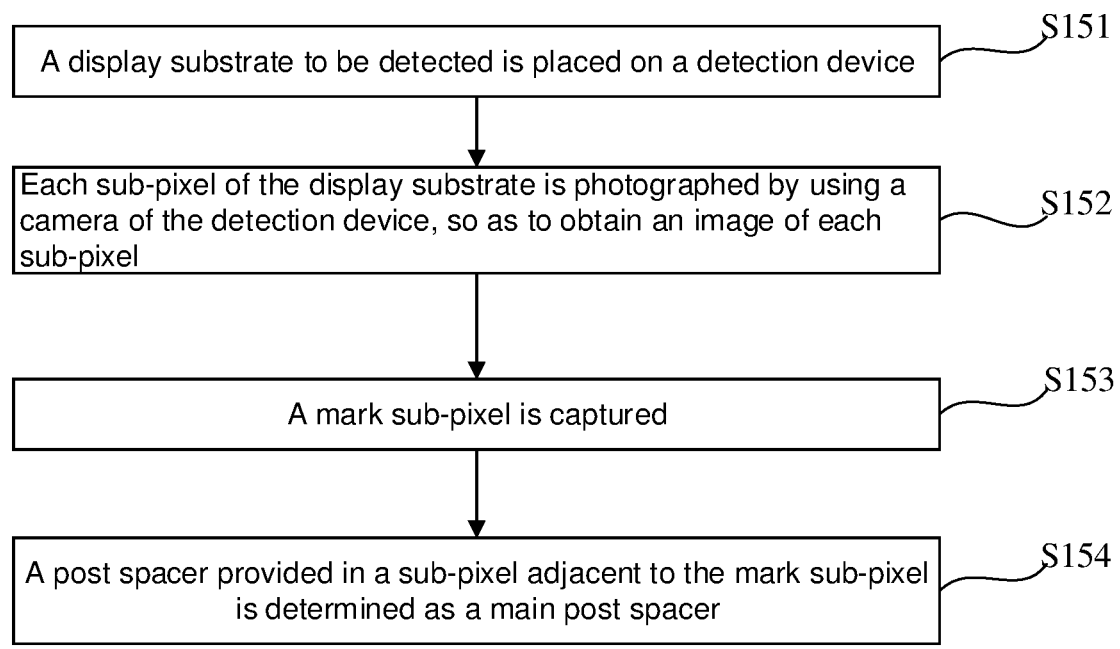
FIG. 15 shows a flowchart of a method of detecting a post spacer according to some exemplary embodiments of the present disclosure.
Figure 16:
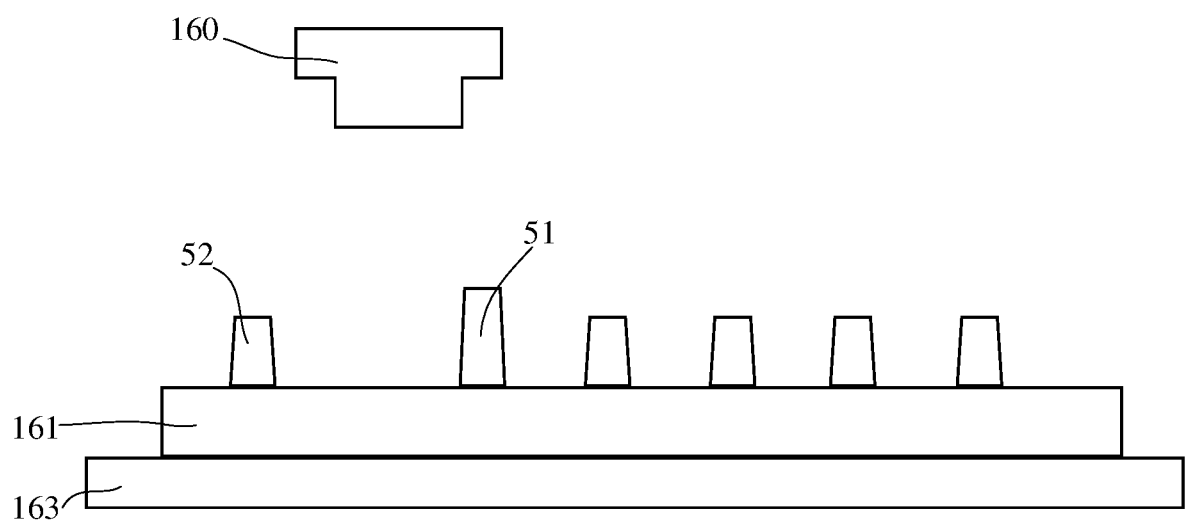
FIG. 16 shows a schematic diagram of a detection device used in the method of detecting the post spacer according to some exemplary embodiments of the present disclosure.

FIG. 15 shows a flowchart of a method of detecting a post spacer according to some exemplary embodiments of the present disclosure. FIG. 16 shows a schematic diagram of a detection device of detecting the post spacer according to some exemplary embodiments of the present disclosure. Hereinafter, steps of the method of detecting the post spacer according to some exemplary embodiments of the present disclosure will be described with reference to FIG. 15 and FIG. 16.

In step S151, a display substrate to be detected is placed on the detection device. The substrate may be the color filter substrate or the array substrate described above. As shown in FIG. 16, the substrate may include a base substrate 161, and a main post spacer 51 and a sub post spacer 52 arranged on the base substrate 161. The main post spacer 51 has a height greater than that of the sub post spacer 52.

For example, the detection device may be a color filter pad height measuring machine, which may include a CCD camera 160 and a measuring base 163.

In step S152, each sub-pixel of the substrate is photographed by using the CCD camera 160, so as to obtain an image of each sub-pixel.

In step S153, the mark sub-pixel that is provided with no post spacer, i.e., that is blank, is captured.

In step S154, the post spacer provided in a sub-pixel adjacent to the mark sub-pixel is determined as the main post spacer 51. For example, for various substrates provided in the embodiments described above, the mark sub-pixels are all located on the left side of the main post spacer 51, and it may be determined that the post spacer provided in the sub-pixel adjacent to the mark sub-pixel and located on the right side of the mark sub-pixel is the main post spacer 51.

Through the detection method of the embodiments of the present disclosure, the position of the main post spacer may be determined quickly and accurately by detecting the mark sub-pixel, so that the detection accuracy and the detection efficiency may be improved.

In exemplary embodiments of the present disclosure, a display substrate, including: a base substrate; a plurality of sub-pixels arranged on the base substrate in an array in a row direction and a column direction; and a plurality of post spacers arranged at intervals on the base substrate, wherein the plurality of post spacers include at least one main post spacer and a plurality of sub post spacers, and each main post spacer of the at least one main post spacer has a height greater than a height of each of the sub post spacers, wherein each of the plurality of sub-pixels has at most one of the plurality of post spacers provided therein, the plurality of sub-pixels include a main sub-pixel provided with the main post spacer and a sub sub-pixel provided with the sub post spacer, the plurality of sub-pixels further include at least one vice sub-pixel adjacent to the main sub-pixel in the row direction or the column direction, and the at least one vice sub-pixel is provided with none of the plurality of post spacers, wherein four vice sub-pixels adjacent in the row direction and the column direction are arranged in a quadrilateral including a first diagonal line having a first acute angle with the row direction and a second diagonal line having a second acute angle with the column direction.

In exemplary embodiments of the present disclosure, a display substrate includes a plurality of main post spacers, a plurality of main sub-pixels and a plurality of vice sub-pixels, each main sub-pixel of the main sub-pixels is provided with only one of the main post spacers, the plurality of vice sub-pixels are respectively adjacent to the plurality of main sub-pixels, and the plurality of vice sub-pixels are located on the same side of respective adjacent main sub-pixels, or the plurality of vice sub-pixels are located on both sides of respective adjacent main sub-pixels.

In exemplary embodiments of the present disclosure, said each main post spacer is adjacent to two sub post spacers of the sub post spacers in the row direction, and in a post spacer group including said each main post spacer and the two sub post spacers adjacent to said each main post spacer in the row direction, a separation distance between said each main post spacer and one of the two sub post spacers is greater than or equal to a separation distance between said each main post spacer and the other of the two sub post spacers.

In exemplary embodiments of the present disclosure, in the post spacer group including said each main post spacer and the two sub post spacers adjacent to said each main post spacer in the row direction, the separation distance between said each main post spacer and one of the two sub post spacers is more than 2 times the separation distance between said each main post spacer and the other of the two sub post spacers.

In exemplary embodiments of the present disclosure, four main post spacers adjacent in the row direction and the column direction are arranged in a quadrilateral including a first diagonal line parallel to the row direction and a second diagonal line parallel to the column direction.

In exemplary embodiments of the present disclosure, two adjacent sides of the quadrilateral in the row direction have the same length, and two adjacent sides of the quadrilateral in the column direction have different lengths.

In exemplary embodiments of the present disclosure, the quadrilateral includes a parallelogram.

In exemplary embodiments of the present disclosure, the first diagonal line has a length greater than a length of the second diagonal line; or the first diagonal line has a length smaller than a length of the second diagonal line.

In exemplary embodiments of the present disclosure, a ratio of a length of a longer diagonal line of the first diagonal line and the second diagonal line to a length of a shorter diagonal line of the first diagonal line and the second diagonal line is greater than 1 and less than or equal to 4.

In exemplary embodiments of the present disclosure, four main post spacers adjacent in the row direction and the column direction are arranged in a quadrilateral including a first diagonal line having a first acute angle with the row direction and a second diagonal line having a second acute angle with the column direction, a geometric center of each post spacer has a deviation in the row direction with respect to a geometric center of a sub-pixel where said each post spacer is located, wherein post spacers located in adjacent rows have opposite deviation directions, and post spacers located in the same row have the same deviation direction.

In exemplary embodiments of the present disclosure, the opposite deviation directions includes a first direction and a second direction opposite to the first direction, post spacers having a deviation direction in the first direction are each located in a single sub-pixel, and post spacers having a deviation direction in the second direction are each located between two adjacent sub-pixels in the row direction.

In exemplary embodiments of the present disclosure, in the plurality of sub-pixels includes a red sub-pixel, a green sub-pixel and a blue sub-pixel, the post spacers having a deviation direction in the first direction are each located in the red sub-pixel, the post spacers having a deviation direction in the second direction are each located between the red sub-pixel and the blue sub-pixel adjacent to the red sub-pixel in the row direction.

In exemplary embodiments of the present disclosure, the display substrate further includes a black matrix arranged on the base substrate, an orthographic projection of the black matrix on the base substrate is a plurality of strips that extend in the row direction and are arranged in the column direction, each of the plurality of strips includes a first area overlapping an orthographic projection of the main post spacer on the base substrate and a second area overlapping an orthographic projection of the sub post spacer on the base substrate, a size of the first area in the column direction is greater than a size of the second area in the column direction, an edge of the first area expands in a circular arc shape in the second direction, and the main post spacer is located at a center of the first area.

In exemplary embodiments of the present disclosure, the base substrate is a color filter substrate, and the display substrate further includes a black matrix arranged on the base substrate and a color filter layer arranged on the base substrate, an orthographic projection of each of the post spacers on the base substrate falls within an orthographic projection of the black matrix on the base substrate; or the display substrate is a COA array substrate, and the display substrate further includes: a plurality of thin film transistors arranged on the base substrate; a black matrix arranged on a side of the thin film transistors away from the base substrate; and a color filter layer arranged on a side of the black matrix away from the base substrate, wherein an orthographic projection of each of the post spacers on the base substrate falls within an orthographic projection of the black matrix on the base substrate.

In exemplary embodiments of the present disclosure, the orthographic projection of said each of the post spacers on the base substrate falls within an orthographic projection of the thin film transistors on the base substrate.

In exemplary embodiments of the present disclosure, the vice sub-pixel is a green sub-pixel.

Although some embodiments according to the general inventive concept of the present disclosure have been illustrated and described, it should be understood by those ordinary skilled in the art that these embodiments may be changed without departing from the principle and spirit of the general inventive concept of the present disclosure. The scope of the present disclosure is defined by the claims and their equivalents.

What is claimed is:

1. A display substrate, comprising:
a base substrate;
a plurality of sub-pixels arranged on the base substrate in an array in a row direction and a column direction; and
a plurality of post spacers arranged at intervals on the base substrate, wherein the plurality of post spacers comprise a plurality of main post spacers and a plurality of sub post spacers, and each main post spacer of the plurality of main post spacers has a height greater than a height of each of the plurality of sub post spacers,
wherein each of the plurality of sub-pixels has at most one of the plurality of post spacers provided therein, the plurality of sub-pixels comprise a plurality of main sub-pixels each provided with one of the plurality of main post spacers and a plurality of sub sub-pixels each provided with one of the plurality of sub post spacers, the plurality of sub-pixels further comprise a plurality of mark sub-pixels respectively adjacent to the plurality of main sub-pixels in the row direction or the column direction, and the plurality of mark sub-pixels are provided with none of the plurality of post spacers,
wherein four main post spacers adjacent in the row direction and the column direction are arranged in a quadrilateral including a first diagonal line parallel to the row direction and a second diagonal line parallel to the column direction.

2. The display substrate of claim 1, wherein the plurality of mark sub-pixels are located on the same side of respective adjacent main sub-pixels.

3. The display substrate of claim 1, wherein said each main post spacer is adjacent to two sub post spacers of the plurality of sub post spacers in the row direction, and in a post spacer group comprising said each main post spacer and the two sub post spacers adjacent to said each main post spacer in the row direction, a separation distance between said each main post spacer and one of the two sub post spacers is greater than a separation distance between said each main post spacer and the other of the two sub post spacers.

4. The display substrate of claim 1, wherein said each main post spacer is adjacent to two sub post spacers of the plurality of sub post spacers in the column direction, and in a post spacer group comprising said each main post spacer and the two sub post spacers adjacent to said each main post spacer in the column direction, a separation distance between said each main post spacer and one of the two sub post spacers is equal to a separation distance between said each main post spacer and the other of the two sub post spacers.

5. The display substrate of claim 1, wherein two adjacent sides of the quadrilateral in the row direction have the same length, and two adjacent sides of the quadrilateral in the column direction have different lengths.

6. The display substrate of claim 1, wherein the quadrilateral comprises a parallelogram.

7. The display substrate of claim 1, wherein the first diagonal line has a length greater than a length of the second diagonal line; or the first diagonal line has a length smaller than a length of the second diagonal line.

8. The display substrate of claim 7, wherein a ratio of a length of a longer diagonal line of the first diagonal line and the second diagonal line to a length of a shorter diagonal line of the first diagonal line and the second diagonal line is greater than 1 and less than or equal to 4.

9. The display substrate of claim 8, wherein the base substrate is a color filter substrate, and the display substrate further comprises a black matrix arranged on the base substrate and a color filter layer arranged on the base substrate, an orthographic projection of each of the plurality of post spacers on the base substrate falls within an orthographic projection of the black matrix on the base substrate.

10. The display substrate of claim 8, wherein the display substrate is a color filter on array substrate, and the display substrate further comprises: a plurality of thin film transistors arranged on the base substrate; a black matrix arranged on a side of the plurality of thin film transistors away from the base substrate; and a color filter layer arranged on a side of the black matrix away from the base substrate, wherein an orthographic projection of each of the plurality of post spacers on the base substrate falls within an orthographic projection of the black matrix on the base substrate.

11. The display substrate of claim 10, wherein the orthographic projection of said each of the plurality of post spacers on the base substrate falls within an orthographic projection of the plurality of thin film transistors on the base substrate.

12. The display substrate of claim 1, wherein the plurality of sub-pixels comprises red sub-pixels, green sub-pixels, and blue sub-pixels, and the plurality of mark sub-pixels are the green sub-pixels.

13. A display panel, comprising the display substrate of claim 1.

14. A display device, comprising the display panel of claim 13.

15. A method of detecting a post spacer on a display substrate, comprising:
  placing a display substrate to be detected on a detection device, wherein the display substrate to be detected is the display substrate of claim 1;
  photographing each sub-pixel of the display substrate by using a camera of the detection device, so as to obtain an image of each sub-pixel;
  capturing the mark sub-pixel; and
  determining a post spacer provided in a sub-pixel adjacent to the mark sub-pixel as a main post spacer.

* * * * *